United States Patent
Folkmann

(10) Patent No.: US 9,444,415 B2
(45) Date of Patent: Sep. 13, 2016

(54) POWER AMPLIFIER SPURIOUS CANCELLATION

(71) Applicant: RF Micro Devices, Inc., Greensboro, NC (US)

(72) Inventor: Andrew F. Folkmann, Cedar Rapids, IA (US)

(73) Assignee: Qorvo US, Inc., Greensboro, NC (US)

( * ) Notice: Subject to any disclaimer, the term of this patent is extended or adjusted under 35 U.S.C. 154(b) by 2 days.

(21) Appl. No.: 14/202,493

(22) Filed: Mar. 10, 2014

(65) Prior Publication Data

US 2014/0253244 A1 Sep. 11, 2014

Related U.S. Application Data

(60) Provisional application No. 61/775,155, filed on Mar. 8, 2013.

(51) Int. Cl.
| | |
|---|---|
| *H03F 1/30* | (2006.01) |
| *H03F 3/19* | (2006.01) |
| *H03F 3/21* | (2006.01) |
| *H03F 1/32* | (2006.01) |
| *H03F 3/24* | (2006.01) |
| *H03G 3/30* | (2006.01) |
| *H03F 1/02* | (2006.01) |

(52) U.S. Cl.
CPC .............. *H03F 3/19* (2013.01); *H03F 1/3247* (2013.01); *H03F 3/21* (2013.01); *H03F 3/245* (2013.01); *H03F 1/0244* (2013.01); *H03F 2200/411* (2013.01); *H03G 3/3042* (2013.01)

(58) Field of Classification Search
CPC .............. H03F 3/19; H03F 3/21; H03F 1/30; H03F 1/0244; H03F 1/3247; H03F 3/245; H03F 3/3042; H03F 2200/411

USPC ................ 330/291, 127, 149, 297
See application file for complete search history.

(56) References Cited

U.S. PATENT DOCUMENTS 7,471,155 B1 * 12/2008 Levesque .................. H03F 1/30
330/296

OTHER PUBLICATIONS

Chow, Albert C., et al., "Design and evaluation of an active ripple filter using voltage injection," 2001 IEEE 32nd Annual Power Electronics Specialists Conference, PESC, vol. 1, 2001, 8 pages.

(Continued)

*Primary Examiner* — Steven J Mottola
*Assistant Examiner* — Hafizur Rahman
(74) *Attorney, Agent, or Firm* — Withrow & Terranova, P.L.L.C.

(57) ABSTRACT

This disclosure relates generally to power amplification devices and methods of operating the same. The power amplification devices are capable of reducing (and possibly cancelling) modulation of a ripple variation of a supply voltage level of a supply voltage onto a radio frequency (RF) signal. In one embodiment, a power amplification device includes a power amplification circuit configured to amplify an RF signal with a supply voltage such that a ripple variation in a supply voltage level of the supply voltage is modulated onto the RF signal in accordance with a conversion gain. However, the power amplification device also includes a plurality of ripple rejection circuits. The plurality of ripple rejection circuits is configured to produce phase shifts and one or more amplitude shifts in the RF signal so as to reduce the conversion gain of the power amplification circuit.

22 Claims, 15 Drawing Sheets

(56) References Cited

OTHER PUBLICATIONS

Diaz, Daniel, et al., "Dynamic Analysis of a Boost Converter With Ripple Cancellation Network by Model-Reduction Techniques," IEEE Transactions on Power Electronics, vol. 24, No. 12, Sep. 15, 2009, 7 pages.

Poon, N.K., et al., "Techniques for input ripple current cancellation: classification and implementation," IEEE Transactions on Power Electronics, vol. 15, No. 6, Nov. 2000, 14 pages.

\* cited by examiner

US 9,444,415 B2

POWER AMPLIFIER SPURIOUS CANCELLATION

RELATED APPLICATION

This application claims the benefit of provisional patent application Ser. No. 61/775,155, filed on Mar. 8, 2013, the disclosure of which is hereby incorporated herein by reference in its entirety.

FIELD OF THE DISCLOSURE

This disclosure relates generally to power amplification devices.

BACKGROUND

Power amplification devices are typically powered by one or more input signals, such as supply voltages, bias signals, supply currents, and/or the like. In practice, the input signals have a signal level that undergoes a ripple variation as a result of non-ideal circuit behavior (e.g., ripple variation resulting from circuitry performing DC to DC conversions, ripple variation resulting from AC to DC conversions, ripple variation in low dropout (LDO) regulators, etc.). Ideally, these power amplification devices have infinite ripple rejection. Thus, ideally, the conversion gain of the power amplification devices is zero (0). Consequently, none of the ripple variation in the input signals is modulated onto a radio frequency (RF) signal being amplified by a power amplification device, in which case the ripple variation of the input signals would have no adverse effect on the performance of the power amplification device. However, in practice, while the ripple rejection of the power amplification devices may be large, the ripple rejection is not infinite, and thus, the conversion gain of the power amplification devices is typically greater than zero. Therefore, the ripple variation of the input signals is modulated onto a signal level of the RF signal being amplified as spurious emissions. Accordingly, to reduce the spurious emission in the RF signal, power amplification devices are needed that are capable of reducing modulation of a ripple variation of the input signals onto the RF signal.

SUMMARY

This disclosure relates generally to power amplification devices and methods of operating the same. The power amplification devices are capable of eliminating, or at least reducing, modulation of a ripple variation of a supply voltage level of a supply voltage onto a radio frequency (RF) signal. In one embodiment, a power amplification device includes a power amplification circuit configured to amplify an RF signal with a supply voltage such that a ripple variation in a supply voltage level of the supply voltage is modulated onto the RF signal in accordance with a conversion gain. However, the power amplification device also includes a plurality of ripple rejection circuits. The plurality of ripple rejection circuits is configured to produce phase shifts and one or more amplitude shifts in the RF signal so as to reduce the conversion gain of the power amplification circuit. In this manner, the power amplification device is capable of reducing (and possibly completely cancelling) modulation of a ripple variation of a supply voltage.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

This disclosure relates generally to systems and methods for providing amplification to radio frequency (RF) signals. More specifically, embodiments of power amplification devices and methods of operating the same are disclosed that provide amplification to RF signals using a supply voltage. In addition, the power amplification devices and methods disclosed are capable of eliminating or at least reducing modulation of a ripple variation in a supply voltage level of the supply voltage onto the RF signal. As such, the power amplification devices and methods described herein can provide amplification of RF signals while reducing the spurious emissions in the RF signal that may result from amplification.

Figure 1:
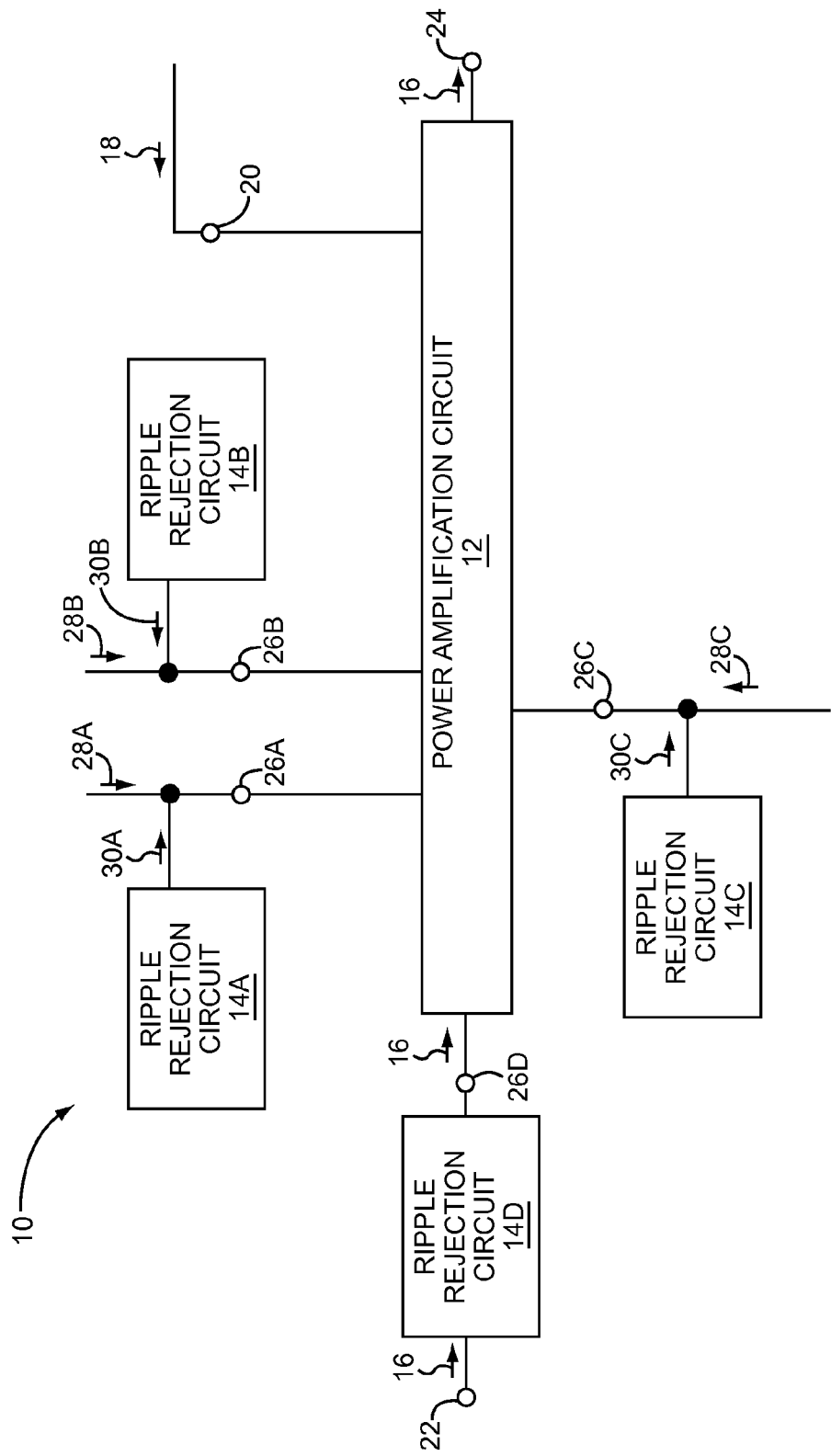
FIG. 1 is a block diagram of one embodiment of a power amplification device capable of reducing and/or eliminating spurious emissions.

FIG. 1 is a block diagram of one embodiment of a power amplification device 10 capable of reducing and/or eliminating spurious emissions. The power amplification device 10 includes a power amplification circuit 12 and a plurality of ripple rejection circuits (referred to generically as elements 14, and specifically as elements 14A, 14B, 14C, and 14D).

The power amplification circuit 12 has both an amplification gain and a conversion gain. More specifically, the power amplification circuit 12 is configured to amplify an RF signal 16 with a supply voltage 18. The supply voltage 18 thereby powers amplification of the RF signal 16 where the amplification gain of the power amplification circuit 12 is simply a measure of an RF signal level of the RF signal 16 at an input of the power amplification circuit 12, versus the RF signal level of the RF signal 16 at an output. In this embodiment, the amplification gain of the power amplification circuit 12 is based on a supply voltage level V1 of the supply voltage 18. The power amplification circuit 12 includes a supply voltage input terminus 20 for receiving the supply voltage 18.

The supply voltage level V1 of the supply voltage 18 may have a ripple variation. For example, the ripple variation in the supply voltage level V1 of the supply voltage 18 may result in the supply voltage level V1 of the supply voltage 18 oscillating about an average DC value of the supply voltage level V1. This ripple variation in the supply voltage level V1 may thus cause a variation in the amplification gain based on the ripple variation in the supply voltage level V1. As a result, the ripple variation in the supply voltage level V1 in the supply voltage 18 is modulated onto the RF signal 16. The conversion gain of the power amplification circuit 12 is thus simply a measure of a magnitude of the ripple variation modulated onto the RF signal 16 at an output versus a magnitude of the ripple variation in the supply voltage level V1 of the supply voltage 18 at an input (e.g., the supply voltage input terminus 20). Thus, the power amplification circuit 12 is configured to amplify the RF signal 16 with the supply voltage 18 such that the ripple variation in the supply voltage level V1 of the supply voltage 18 is modulated onto the RF signal 16 in accordance with the conversion gain of the power amplification circuit 12.

The ripple variation in the supply voltage level V1 of the supply voltage 18 may be the result of various electrical conditions and/or components. For example, the ripple variation in the supply voltage level V1 of the supply voltage 18 may be generated by an RF power converter using a switching topology. RF power converters that use switching topologies naturally generate the supply voltage 18 where the supply voltage level V1 oscillates in accordance with a ripple variation. Alternatively, the supply voltage 18 may be generated by the RF power converter using a voltage regulation circuit, such as a low drop-out voltage regulation circuit. While ideally, voltage regulation circuits generate the supply voltage 18 so that the supply voltage level V1 does not have a ripple variation, in practice, the voltage regulation circuit does generate the supply voltage 18 with the supply voltage level V1 having a ripple variation. This ripple variation of the supply voltage level V1 may be due to various factors, such as the response feed of the voltage regulation circuit, power source voltage fluctuations, temperature fluctuations, and/or the like. Furthermore, the ripple variation in the supply voltage level V1 of the supply voltage 18 may be the result of either impedance mismatches or chaotic idiosyncrasies of the electrical components being utilized to generate the supply voltage 18 and/or of the power amplification device 10.

The power amplification device 10 further includes an RF input terminus 22 for exogenously receiving the RF signal 16 and an RF output terminus 24 for exogenously transmitting the RF signal 16 to upstream RF circuitry (not shown) once the RF signal 16 has been amplified by the power amplification circuit 12. In this example, the power amplification circuit 12 further includes amplification circuit input termini (referred to generically as elements 26, and specifically as elements 26A, 26B, 26C, and 26D). In this embodiment, the amplification circuit input termini 26 are a plurality of input terminals other than the supply voltage input terminus 20 for receiving the supply voltage 18. Thus, the amplification circuit input termini 26 do not include the supply voltage input terminus 20.

In the embodiment shown in FIG. 1, each of the ripple rejection circuits 14A, 14B, 14C, and 14D is coupled to one of the amplification circuit input termini 26A, 26B, 26C, and 26D, respectively. Thus, the plurality of ripple rejection circuits 14 is coupled so as to correspond injectively with the plurality of amplification circuit input termini 26. Note also that in this particular embodiment, the ripple rejection circuits 14 are also coupled to correspond surjectively with the plurality of amplification circuit input termini 26. As explained in further detail below, in other embodiments, the ripple rejection circuits 14 may not correspond surjectively with the amplification circuit input termini 26. However, with regard to the embodiment of the power amplification device 10 shown in FIG. 1, there is both injective and surjective correspondence between the plurality of ripple rejection circuits 14 and the amplification circuit input termini 26. As such, the plurality of ripple rejection circuits 14 of FIG. 1 is coupled so that the amplification circuit input termini 26 correspond bijectively to the plurality of amplification circuit input termini 26.

Note that in this embodiment, the ripple rejection circuit 14D is coupled between the RF input terminus 22 and the amplifier circuit input terminus 26D. The power amplification circuit 12 thus receives the RF signal 16 as an input signal at the amplifier circuit input terminus 26D. However, as shall be explained in further detail below, in other embodiments, the power amplification circuit 12 may not include a separate amplification circuit input terminus 26, such as the amplifier circuit input terminus 26D, in order to receive the RF signal 16. Instead, the RF input terminus 22 may also be an amplification circuit input terminus 26 of the power amplification circuit 12. Furthermore, with regard to the term "terminus," terminus refers to any component or set of components configured to input and/or output a signal. For example, in FIG. 1, the power amplification device 10 is illustrated as receiving the RF signal 16 as a single-ended signal at the RF input terminus 22. Thus, the RF input terminus 22 shown in FIG. 1 may be provided by a single terminal. However, in other embodiments, the RF signal 16 may be received as a differential signal. In this embodiment, the RF input terminus 22 would be provided as a pair of terminals configured to receive and/or transmit differential signals. Also, note that termini may be provided by terminals, combinations of terminals, nodes, combinations of nodes, ports, combinations of ports, contacts, combinations of contacts, pads, combinations of pads, combinations of the aforementioned types of termini, and/or the like.

Referring again to FIG. 1, the higher the conversion gain of the power amplification circuit 12, the more noise is introduced into the RF signal 16 by the ripple variation in the supply voltage level V1 of the supply voltage 18. In contrast, the spurious emissions caused by the ripple variation in the supply voltage level V1 of the supply voltage 18 are reduced more and more the lower the conversion gain of the power amplification circuit 12. Accordingly, the plurality of ripple rejection circuits 14 is configured to produce phase shifts and one or more amplitude shifts in the RF signal 16 so as to reduce the conversion gain of the power amplification circuit 12. At least two phase shifts are provided by the plurality of ripple rejection circuits 14 and at least one amplitude shift is provided by the plurality of ripple rejection circuits 14.

In the embodiment shown in FIG. 1, the ripple rejection circuit 14A is coupled to the amplification circuit input terminus 26A and is configured to produce a first amplitude shift and a first phase shift in the RF signal 16. The ripple rejection circuit 14B is coupled to the amplification circuit input terminus 26B and is configured to produce a second amplitude shift and a second phase shift in the RF signal 16. The ripple rejection circuit 14C is coupled to the amplification circuit input terminus 26C and is configured to produce a third amplitude shift and a third phase shift in the RF signal 16. The ripple rejection circuit 14D is coupled to the amplification circuit input terminus 26D and is configured to produce a fourth phase shift in the RF signal 16, but not another amplitude shift. Each of the amplitude shifts (e.g., the first amplitude shift, the second amplitude shift, and the third amplitude shift) and each of the phase shifts (e.g., the first phase shift, the second phase shift, the third phase shift, and the fourth phase shift) is based on the supply voltage level V1 of the supply voltage 18 and is proportioned so as to reduce the conversion gain of the power amplification circuit 12.

For example, the ripple rejection circuit 14A may be a ripple correction circuit, the ripple rejection circuit 14B may be another ripple correction circuit, and the ripple rejection circuit 14C may be yet another ripple correction circuit. The ripple rejection circuit 14D may be a phase modulator. Each of the amplification circuit input termini 26A, 26B, and 26C is operable to receive one of a plurality of input signals (referred to generically as element 28, and specifically as elements 28A, 28B, and 28C). More specifically, the amplification circuit input terminus 26A is operable to receive the input signal 28A. The amplification circuit input terminus 26B is operable to receive the input signal 28B. Finally, the amplification circuit input terminus 26C is operable to receive the input signal 28C.

Each of the ripple rejection circuits 14A, 14B, 14C is configured to generate one of a plurality of ripple correction signals (referred to generically as elements 30, and specifically as elements 30A, 30B, 30C). More specifically, the ripple rejection circuit 14A generates the ripple correction signal 30A based on the supply voltage level V1 of the supply voltage 18. The ripple rejection circuit 14A is coupled to the amplification circuit input terminus 26A so as to apply the ripple correction signal 30A to the input signal 28A. The input signal 28A is then received at the amplification circuit input terminus 26A once the ripple correction signal 30A has been applied to the input signal 28A. By applying the ripple correction signal 30A to the input signal 28A, the ripple rejection circuit 14A produces the first amplitude shift and the first phase shift in the RF signal 16.

The ripple rejection circuit 14B generates the ripple correction signal 30B based on the supply voltage level V1 of the supply voltage 18. The ripple rejection circuit 14B is coupled to the amplification circuit input terminus 26B so as to apply the ripple correction signal 30B to the input signal 28B. The input signal 28B is then received at the amplification circuit input terminus 26B once the ripple correction signal 30B has been applied to the input signal 28B. By applying the ripple correction signal 30B to the input signal 28B, the ripple rejection circuit 14B produces the second amplitude shift and the second phase shift in the RF signal 16.

The ripple rejection circuit 14C generates the ripple correction signal 30C based on the supply voltage level V1 of the supply voltage 18. The ripple rejection circuit 14C is coupled to the amplification circuit input terminus 26C so as to apply the ripple correction signal 30C to the input signal 28C. The input signal 28C is then received at the amplification circuit input terminus 26C once the ripple correction signal 30C has been applied to the input signal 28C. By applying the ripple correction signal 30C to the input signal 28C, the ripple rejection circuit 14C produces the third amplitude shift and the third phase shift in the RF signal 16.

The amplifier circuit input terminus 26D is configured to receive the RF signal 16 as an input signal. As mentioned above, the ripple rejection circuit 14D may be a phase modulator coupled to the amplifier circuit input terminus 26D. More specifically, the ripple rejection circuit 14D is coupled between the RF input terminus 22 and the amplifier circuit input terminus 26D, and thus is operable to receive the RF signal 16 from the RF input terminus 22. The ripple rejection circuit 14D then produces a phase shift in the RF signal 16 based on the supply voltage level V1 of the supply voltage 18. The RF signal 16 is then received at the amplifier circuit input terminus 26D once the ripple rejection circuit 14D has applied the fourth phase shift.

The ripple rejection circuits 14 produce the phase shifts (e.g., the first phase shift, the second phase shift, the third phase shift, and the fourth phase shift) and the amplitude shifts (e.g., the first amplitude shift, the second amplitude shift, and the third amplitude shift) by adjusting a transfer response of the power amplification device 10 from the RF input terminus 22 to the RF output terminus 24. More specifically, the power amplification device 10 has a transfer response from the RF input terminus 22 to the RF output terminus 24. The transfer response has an amplitude response and a phase response. As such, an amplitude of the RF signal 16 received at the RF input terminus 22 is adjusted by the amplitude response when the RF signal 16 is transmitted from the RF output terminus 24. Similarly, a phase of the RF signal 16 is adjusted in accordance with the phase response when the RF signal 16 is transmitted from the RF output terminus 24. The plurality of ripple rejection circuits 14 is configured to produce the phase shifts (e.g., the first phase shift, the second phase shift, the third phase shift, and the fourth phase shift) in the phase response of the transfer response and thereby in the RF signal 16. Similarly, the ripple rejection circuits 14 are configured to produce the amplitude shifts (e.g., the first amplitude shift, the second amplitude shift, and the third amplitude shift) in the amplitude response of the transfer response and thereby in the RF signal 16. In other words, the ripple rejection circuit 14A produces the first amplitude shift in the amplitude response and the first phase shift in the phase shift response by applying the ripple correction signal 30A to the input signal 28A. The ripple rejection circuit 14B produces the second amplitude shift in the amplitude response and the second phase shift in the phase response by applying the ripple correction signal 30B to the input signal 28B. The ripple rejection circuit 14C produces the third amplitude shift in the amplitude response and the third phase shift in the phase shift response by applying the ripple correction signal 30C to the input signal 28C. The ripple rejection circuit 14D produces the fourth phase shift in the phase response of the transfer response.

The plurality of ripple rejection circuits 14 is configured to produce phase shifts (e.g., the first phase shift, the second phase shift, the third phase shift, and the fourth phase shift) and amplitude shifts (e.g., the first amplitude shift, the second amplitude shift, and the third amplitude shift) in the RF signal 16, and more specifically in the transfer response of the power amplification device 10 from the RF input terminus 22 to the RF output terminus 24, so as to reduce the conversion gain of the power amplification circuit 12 such that the conversion gain of the power amplification circuit 12 is substantially eliminated. In other words, as a result of the conversion gain of the power amplification circuit 12 being substantially eliminated, the modulation of the ripple variation in the supply voltage level V1 of the supply voltage 18 onto the RF signal 16 is substantially rejected. Whether the conversion gain of the power amplification circuit 12 is eliminated may depend on performance parameters, the RF application being implemented, and/or the sensitivity of electronic components being utilized in the RF application. Some or all of these considerations may be taken into account when determining whether the conversion gain is sufficiently close to zero such that it can be considered to have been substantially eliminated.

In this embodiment, the power amplification circuit 12 may include a plurality of amplifier stages. These amplifier stages may be cascaded. For example, the supply voltage input terminus 20 may be coupled to a final amplifier stage where the supply voltage 18 provides the power for amplification by the final amplifier stage. Also, the amplification circuit input termini 26A, 26B may also be the supply voltage input termini 20 where an input signal I1 is a supply voltage that provides power to a driver amplifier stage and an input signal I2 is another supply voltage that provides power to a different driver amplifier stage. In contrast, the amplification circuit input terminus 26C may be a bias input terminus and the input signal 28C may be a bias voltage. Accordingly, a signal level of the input signal 28A may be represented by a voltage level VA, a signal level of the input signal 28B may be represented by a voltage level VB, and a signal level of the input signal 28C may be represented by a voltage level VC. The ripple correction signal 30A has a signal level RCA, the ripple correction signal 30B has a signal level RCB, and the ripple correction signal 30C has a signal level RCC, wherein in this example, the signal level RCA, the signal level RCB, and the signal level RCC are each voltage levels.

The ripple rejection circuit 14A is configured to generate the ripple correction signal 30A such that:

$RCA \cong K_A \times V1$, where $K_A$ is a scaling parameter.

The ripple rejection circuit 14B is configured to generate the ripple correction signal 30B such that:

$RCB \cong K_B \times V1$, where $K_B$ is a scaling parameter $K_B$.

The ripple rejection circuit 14C is configured to generate the ripple correction signal 30C such that:

$RCC \cong K_C \times V1$, where $K_C$ is a scaling parameter $K_C$.

Representing the fourth phase shift provided by the ripple rejection circuit 14D as PD, the ripple rejection circuit 14D is configured to produce the phase shift PD such that:

$PD \cong K_D \times V1$, where $K_D$ is a scaling parameter $K_D$.

The values of the scaling parameters $K_A$, $K_B$, $K_c$, and $K_D$ are selected such that equations $$K_A \frac{\partial AO}{\partial VA} + K_B \frac{\partial AO}{\partial VB} + K_C \frac{\partial AO}{\partial VC} + \frac{\partial AO}{\partial V1} \cong 0 \text{ and}$$

$$K_A \frac{\partial PO}{\partial VA} + K_B \frac{\partial PO}{\partial VB} + K_C \frac{\partial PO}{\partial VC} + K_D \frac{\partial PO}{\partial VD} + \frac{\partial PO}{\partial V1} \cong 0$$

are satisfied. In the above equations, AO is an amplitude of the RF signal 16 at the RF output terminus 24, while PO is a phase of the RF signal 16 at the RF output terminus 24. Note that based on the above equations, the scaling parameters $K_A$, $K_B$, $K_c$, and $K_D$ are selected such that:

$$K_A \frac{\partial AO}{\partial VA} + K_B \frac{\partial AO}{\partial VB} + K_C \frac{\partial AO}{\partial VC} \cong -\frac{\partial AO}{\partial V1}; \text{ and}$$

$$K_A \frac{\partial PO}{\partial VA} + K_B \frac{\partial PO}{\partial VB} + K_C \frac{\partial PO}{\partial VC} + K_D \frac{\partial PO}{\partial VD} \cong \frac{\partial PO}{\partial V1}.$$

With respect to the ripple correction signal 30A with the signal level RCA, the ripple correction signal 30B with the signal level RCB, the ripple correction signal 30C with the signal level RCC, and the fourth phase shift with the phase shift value PD, changes in the amplitude and phase of the RF signal 16 at the RF output terminus 24 counteract the changes in amplitude and phase resulting from the ripple variation in the supply voltage level V1. As a result, changes in the supply voltage level V1 of the supply voltage 18 are cancelled by the first phase shift, the second phase shift, the third phase shift, and the fourth phase shift, and by the first amplitude shift, the second amplitude shift, and the third amplitude shift. As such, the ripple rejection circuits 14 are configured to produce the phase shifts (e.g., the first phase shift, the second phase shift, the third phase shift, and the fourth phase shift) and the amplitude shifts (e.g., the first amplitude shift, the second amplitude shift, and the third amplitude shift) such that the gain conversion of the power amplification circuit 12 is substantially eliminated.

Figure 2:
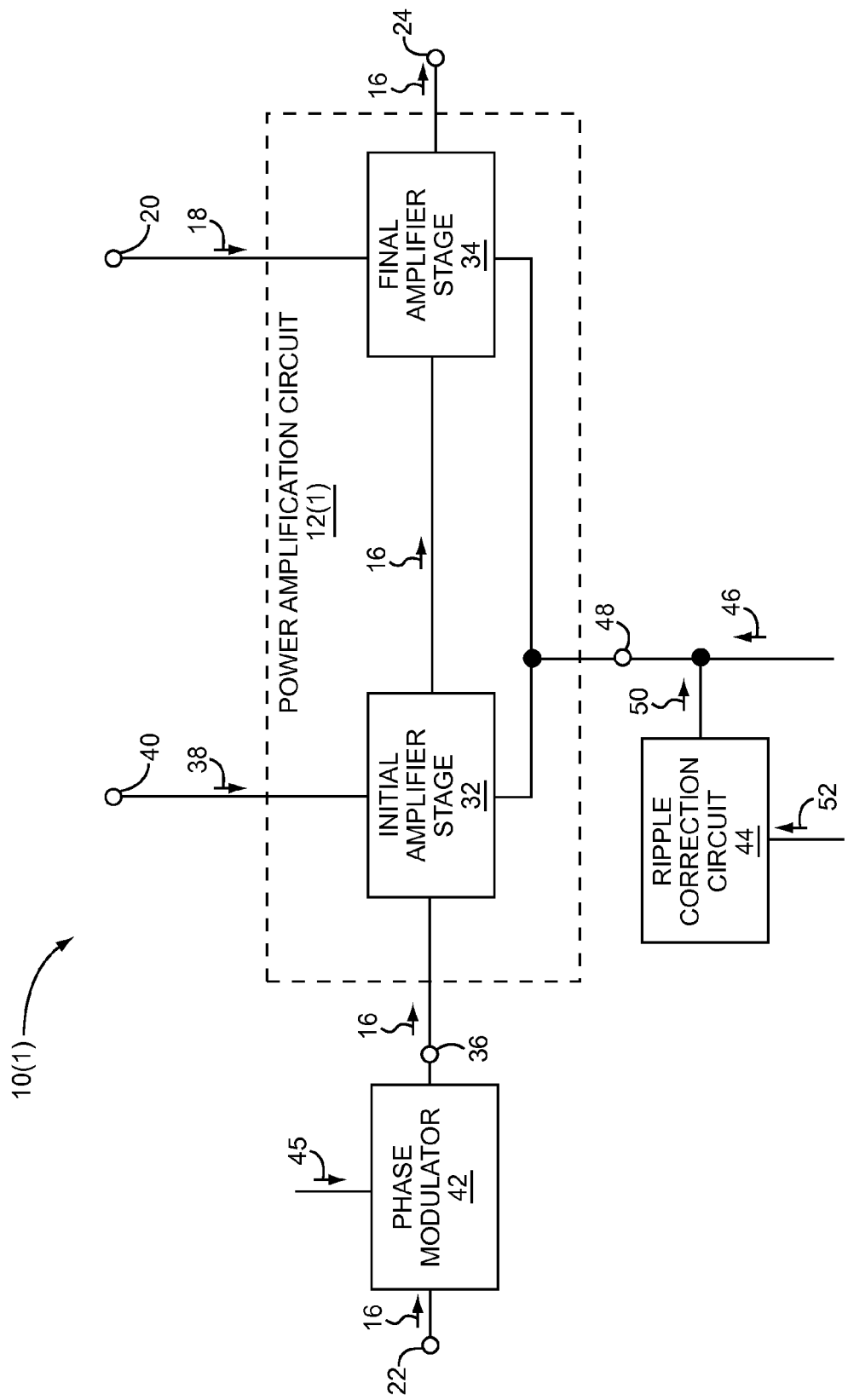
FIG. 2 illustrates one embodiment of a power amplification device.

Referring now to FIG. 2, FIG. 2 illustrates one embodiment of a power amplification device 10(1). The power amplification device 10(1) is one embodiment of the power amplification device 10 shown in FIG. 1. In this embodiment, the power amplification device 10(1) includes a power amplification circuit 12(1), which is an embodiment of the power amplification circuit 12 shown in FIG. 1. The power amplification circuit 12(1) includes a plurality of amplifier stages (e.g., an initial amplifier stage 32 and a final amplifier stage 34) coupled in cascade. The amplifier stages 32, 34 therefore provide amplification to the RF signal 16 in sequence.

The power amplification circuit 12(1) shown in FIG. 2 has the initial amplifier stage 32 and the final amplifier stage 34. However, other embodiments of the power amplification circuit 12(1) may include any number of amplifier stages (such as the initial amplifier stage 32 and the final amplifier stage 34) greater than or equal to two (2). The initial amplifier stage 32 is the amplifier stage at a beginning of the sequence for amplification by the power amplification circuit 12(1). The final amplifier stage 34 is the amplifier stage at an end of the sequence for amplification by the power amplification circuit 12(1). Since at least two amplifier stages are needed to provide cascaded amplifier stages, the power amplification circuit 12(1) includes at least the initial amplifier stage 32 and the final amplifier stage 34. However, the number of amplifier stages may be any integer greater than or equal to one (1). As such, there may be any number (greater than or equal to one (1)) of amplifier stages, as will be explained in further detail below.

Since the initial amplifier stage 32 and the final amplifier stage 34 are coupled in cascade, the amplifier stages 32, 34 provide amplification to the RF signal 16 in sequence. Accordingly, the initial amplifier stage 32 initially provides amplification to the RF signal 16 in accordance with an initial amplification gain Ginitial. Once the RF signal 16 is amplified by the initial amplifier stage 32, the final amplifier stage 34 amplifies the RF signal 16 in accordance with a final amplification gain Gfinal. As such, the amplification gain of the power amplification circuit 12(1) may be approximately equal to Ginitial*Gfinal. As explained in further detail below, if an intermediate amplifier stage were coupled between the initial amplifier stage 32 and the final amplifier stage 34, then the amplification gain for this amplification stage would also be multiplied by the initial amplification gain Ginitial and the final amplification gain Gfinal to obtain the amplification gain of the power amplification circuit 12(1) as a whole. To amplify the RF signal 16, the initial amplifier stage 32 receives the RF signal 16 at an amplifier input terminus 36. The amplifier input terminus 36 is an exemplary embodiment of the amplifier circuit input terminus 26D described above with respect to FIG. 1. The initial amplifier stage 32 amplifies the RF signal 16 in accordance with the initial amplification gain Ginitial, and then transmits the RF signal 16 to the final amplifier stage 34. The final amplifier stage 34 then receives the RF signal 16 and amplifies the RF signal 16 in accordance with the final amplification gain Gfinal. Once the final amplifier stage 34 has provided amplification to the RF signal 16, the final amplifier stage 34 transmits the RF signal 16 from the RF output terminus 24 to downstream RF circuitry (not shown).

To provide power for amplification, the initial amplifier stage 32 receives a supply voltage 38 at a supply voltage input terminus 40. Accordingly, the supply voltage 38 is an example of the input signal 28A shown in FIG. 1 and the supply voltage input terminus 40 is an example of the amplification circuit input terminus 26A shown in FIG. 1. The power provided by the supply voltage 38 is then transferred to the RF signal 16 by the initial amplifier stage 32. As such, the supply voltage 38 has a supply voltage level VS. The initial amplifier stage 32 is configured to set the initial amplification gain Ginitial of the initial amplifier stage 32 in accordance with the supply voltage level VS of the supply voltage 38. The final amplifier stage 34 then receives the RF signal 16 after amplification by the initial amplifier stage 32. To provide power for amplification, the final amplifier stage 34 receives the supply voltage 18 from the supply voltage input terminus 20. The power provided by the supply voltage 18 is then transferred to the RF signal 16. Accordingly, the supply voltage level V1 of the supply voltage 18 sets the final amplification gain Gfinal of the final amplifier stage 34.

Note that as the RF signal 16 progresses through the sequence of amplifier stages 32, 34, each of the amplifier stages 32, 34 handles an increasing amount of power. Therefore, the initial amplifier stage 32 handles the least amount of power, since it receives the RF signal 16 at the amplifier input terminus 36 prior to amplification and transmits the RF signal 16 amplified only in accordance with the initial amplification gain Ginitial. When the final amplifier stage 34 receives the RF signal 16, the RF signal 16 has already been amplified by the initial amplification gain Ginitial. The final amplifier stage 34 further amplifies the RF signal 16 in accordance with the final amplification gain Gfinal. Thus, the final amplifier stage 34 is operable to transmit the RF signal 16 amplified in accordance with the amplification gain Ginitial*Gfinal. Often, the initial amplifier stage 32 and any intermediate amplifier stages (not shown) that are prior to the final amplifier stage 34 are classified as "driver amplifier stages." Each of the amplifier stages 32, 34 may include a transistor or a network of transistors to provide amplification. However, since the final amplifier stage 34 handles the most power, some embodiments of the final amplifier stage 34 may include arrays of transistors or stacks of transistors in order to handle the power level seen by the final amplifier stage 34.

The power amplification device 10(1) has a plurality of ripple rejection circuits. In this example, the ripple rejection circuits are the phase modulator 42 and the ripple correction circuit 44. As mentioned above, the plurality of ripple rejection circuits is configured to produce at least two phase shifts and one amplitude shift in order to reduce the conversion gain of the power amplification circuit 12(1).

The phase modulator 42 is an embodiment of the ripple rejection circuit 14D shown in FIG. 1 and generates a phase shift PS1 having a phase shift value of PSA1. The phase modulator 42 is coupled between the RF input terminus 22 and the amplifier input terminus 36. This phase modulator 42 is configured to produce the phase shift PS1 having the phase shift value PSA1 in the RF signal 16 such that relative to the RF input terminus 22 the RF signal 16 is received at the amplifier input terminus 36 with the phase shift PS1 having the phase shift value PSA1. The phase shift PS1 is based on the supply voltage level V1 of the supply voltage

18. More specifically, the phase modulator 42 is operable to receive a feedback signal 45 having a feedback signal level that is indicative of the signal level of the RF signal 16 at the RF output terminus 24. The phase modulator 42 produces the phase shift PS1 in the RF signal 16 such that:

$PSA1 \cong K_1 \times V1$ where $K_1$ is a scaling parameter $K_1$.

The power amplification circuit 12(1) is configured to receive a bias voltage 46 at a bias input terminus 48. Thus, the bias voltage 46 is an embodiment of the input signal 28C shown in FIG. 1, and the bias input terminus 48 is an example of the amplification circuit input terminus 26C shown in FIG. 1. The bias voltage 46 is received by the power amplification circuit 12(1) at the bias input terminus 48, wherein the bias voltage 46 has a bias voltage level that sets the operating point of both the initial amplifier stage 32 and the final amplifier stage 34 at their inputs.

Referring again to FIG. 2, the ripple correction circuit 44 is configured to generate a ripple correction signal 50 and apply the ripple correction signal 50 to the bias voltage 46 prior to the bias voltage 46 being received at the bias input terminus 48. The ripple correction circuit 44 is thus an embodiment of the ripple rejection circuit 14C shown in FIG. 1, and the ripple correction signal 50 is an embodiment of the ripple correction signal 30C shown in FIG. 1. The ripple correction signal 50 has a ripple correction voltage level RC that is based on the supply voltage level V1 of the supply voltage 18. More specifically, the ripple correction circuit 44 is coupled to receive a feedback signal 52 having a feedback signal level that indicates the signal level of the RF signal 16 at the RF output terminus 24. Using the feedback signal 52, the ripple correction circuit 44 generates the ripple correction signal 50 such that:

$RC \cong K_2 \times V1$, where $K_2$ is a scaling parameter $K_2$.

Thus, by applying the ripple correction signal 50 to the bias voltage 46 before the bias voltage 46 is provided at the bias input terminus 48, the ripple correction circuit 44 produces an amplitude shift AS having an amplitude shift level AS1 and another phase shift PS2 having a phase shift value PSVS. The scaling parameters $K_1$ and $K_2$ are provided such that the conversion gain of the power amplification circuit 12(1) is substantially eliminated such that the ripple variation in the supply voltage level V1 of the supply voltage 18 is substantially rejected.

Figure 3:
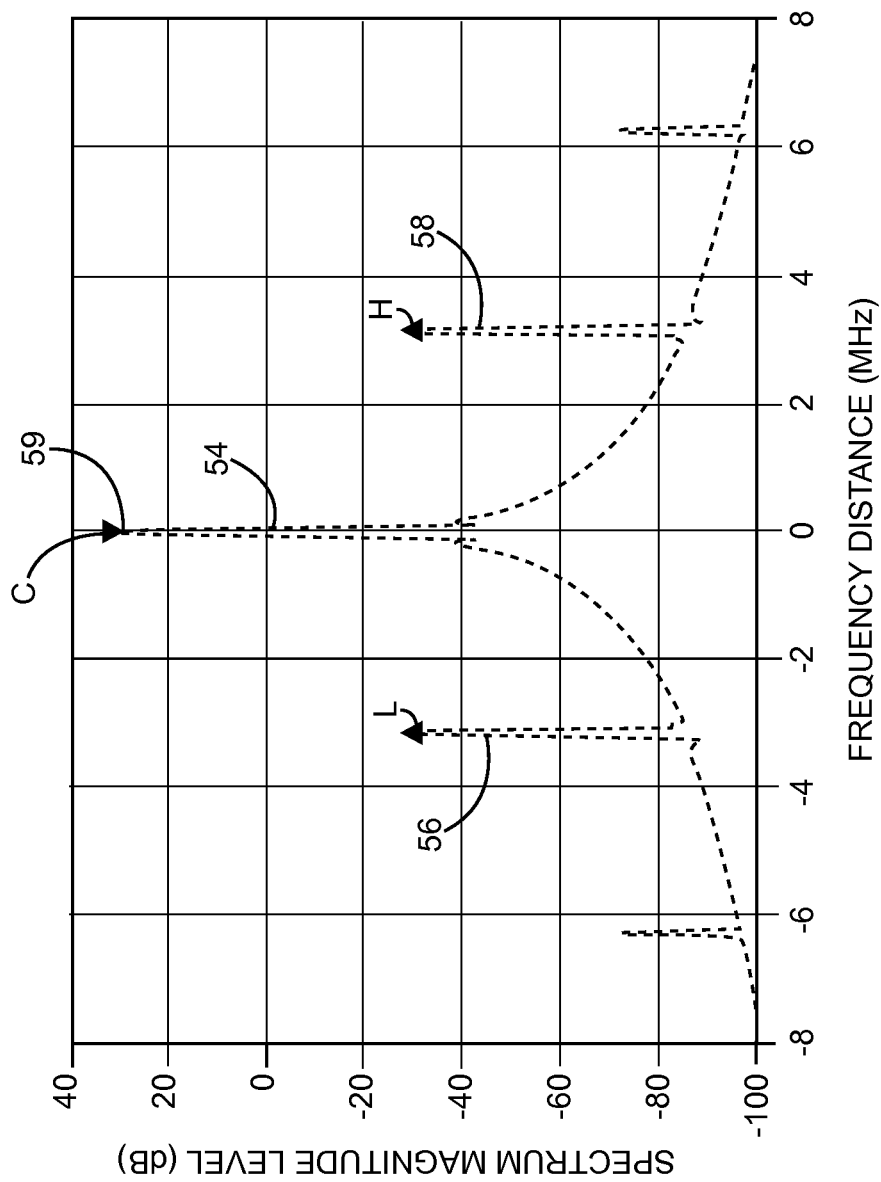
FIG. 3 illustrates one embodiment of the output spectrum of the power amplification device as a function of frequency when both the phase modulator and the ripple correction circuit shown in FIG. 2 are deactivated.

Referring now to FIGS. 2 and 3, FIG. 3 illustrates one embodiment of an output spectrum 54 of the power amplification device 10(1) as a function of frequency when both the phase modulator 42 and the ripple correction circuit 44 shown in FIG. 2 are deactivated. For the sake of clarity, the output spectrum 54 is centered about a carrier frequency of the RF signal 16, and thus the frequencies shown in the graph of FIG. 3 are relative frequency distances from the carrier frequency. As shown in FIG. 3, when the phase modulator 42 and the ripple correction circuit 44 are deactivated, the ripple variation in the supply voltage 18 is modulated onto the RF signal 16, and thus creates a low side band 56 and a high side band 58 in the output spectrum 54. In this example, it is assumed that the ripple variation of the supply voltage level V1 has a 10 millivolt (mV) peak magnitude. The output spectrum 54 has a maximum spectrum magnitude 59 at a carrier frequency C. The low side band 56 and the high side band 58 are each approximately 3.14 MHz from the carrier frequency C. The output spectrum 54 shows that the conversion gain of the power amplification circuit 12(1) is provided so that a peak L of the low side band 56 and a peak H of the high side band 58 are each about 57.7 dB below the maximum magnitude of the output spectrum 54 at the carrier frequency c.

Figure 4:
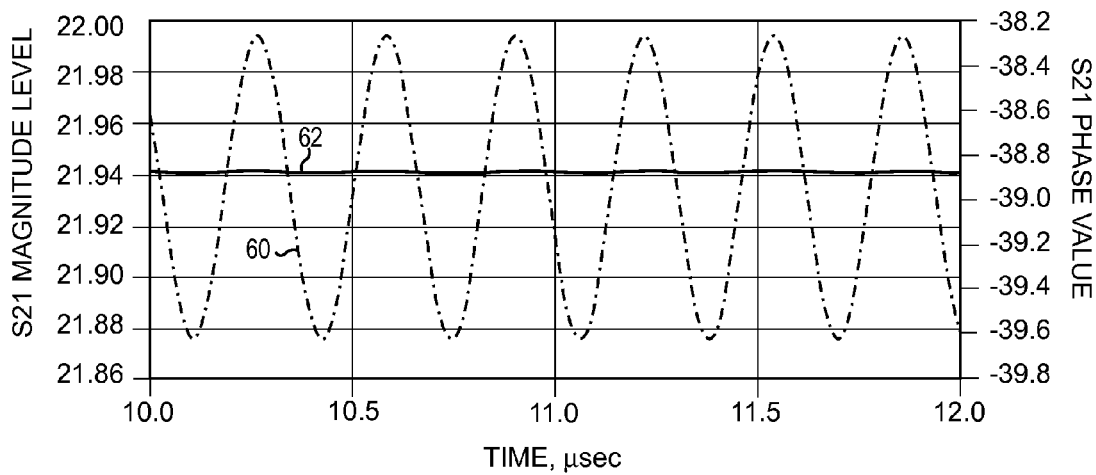
FIG. 4 illustrates a transfer response of the power amplification device shown in FIG. 2 from an RF input terminus to an RF output terminus.

Referring now to FIGS. 2 and 4, FIG. 4 illustrates a transfer response of the power amplification device 10(1) from the RF input terminus 22 to the RF output terminus 24. More specifically, the transfer response of the power amplification device 10(1) is represented using an S21 parameter, which is one way of representing the transfer function of the power amplification device 10(1) from the RF input terminus 22 to the RF output terminus 24. As such, with regard to the S21 parameter shown in FIG. 4, port 1 for the S21 parameter is assumed to be the RF input terminus 22 and port 2 for the S21 parameter is assumed to be the RF output terminus 24. The S21 parameter of the power amplification device 10(1) is illustrated in FIG. 4 as an amplitude response 60 and a phase response 62, where the amplitude response 60 and the phase response 62 are shown varying in time.

As shown in FIG. 4, the ripple variation in the supply voltage 18 causes little to no variation in the phase response 62 and the phase shift value of the S21 response remains relatively steady. However, the ripple variation in the supply voltage level V1 of the supply voltage 18 results in a large variation in a magnitude level of the amplitude response 60 as a function of time. As such, when the phase modulator 42 and the ripple correction circuit 44 are deactivated, the ripple variation in the supply voltage level V1 of the supply voltage 18 causes the amplitude response 60 (i.e., the amplification gain) of the power amplification circuit 12(1) (and in particular, the final amplifier stage 34) to vary, which modulates the RF signal 16 with the ripple variation in accordance with the amplitude response 60.

Figure 5:
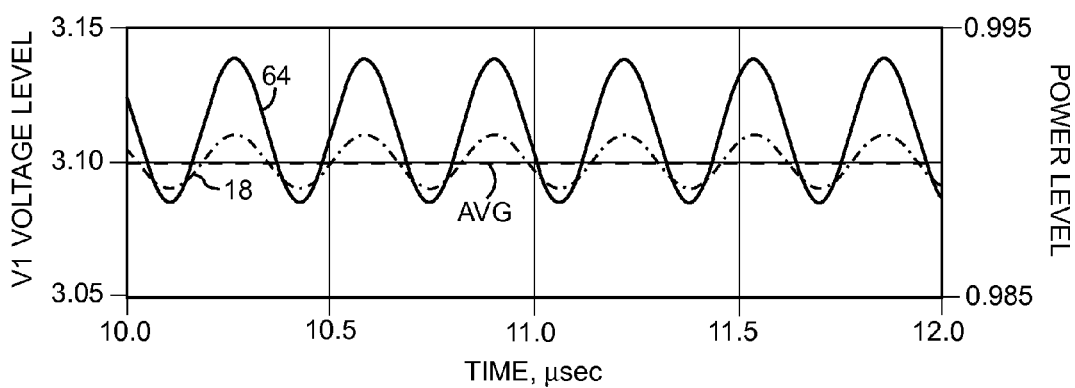
FIG. 5 illustrates one embodiment of a supply voltage and output power of an RF signal as a function of time.

Referring now to FIGS. 2 and 5, FIG. 5 illustrates one embodiment of the supply voltage 18 and an output power 64 of the RF signal 16 as a function of time. As shown in FIG. 5, the supply voltage level V1 of the supply voltage 18 has an average supply voltage level AVG. In this embodiment, the average supply voltage level AVG is around 3.1 mV and remains relatively DC. The supply voltage level V1 has a ripple variation that varies about the average supply voltage level AVG by up to 10 mV. As expected when the ripple correction circuit 44 and the phase modulator 42 are deactivated, the output power 64 of the RF signal 16 varies in accordance with the ripple variation of the supply voltage level V1 in accordance with the conversion gain of the power amplification circuit 12(1).

Figure 6:
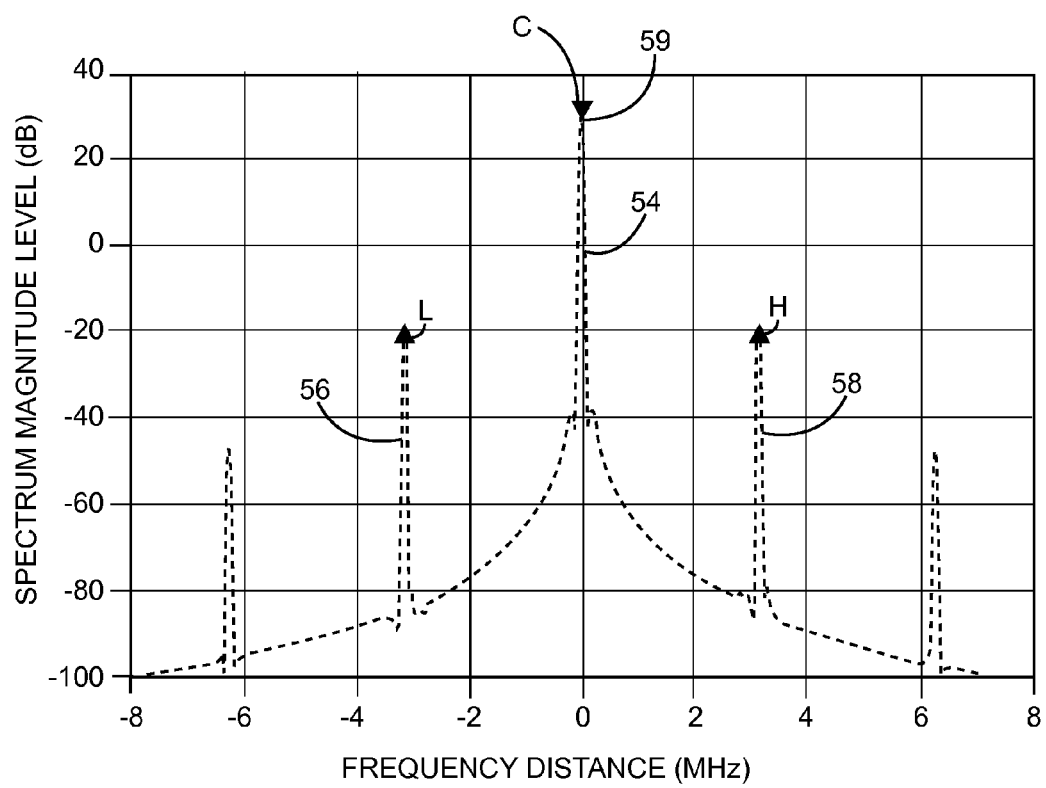
FIG. 6 is a graph illustrating an output spectrum of the power amplification circuit shown in FIG. 2 when the ripple correction circuit is activated but the phase modulator is deactivated.

Referring to FIGS. 2 and 6, FIG. 6 is a graph illustrating the output spectrum 54 of the power amplification circuit 12(1) when the ripple correction circuit 44 is activated but the phase modulator 42 is deactivated. By applying the ripple correction signal 50 to the bias voltage 46, the ripple correction circuit 44 produces the amplitude shift AS and the phase shift PS2. Since the phase modulator 42 is deactivated, the phase shift PS1 is not being produced by the phase modulator 42. As can be seen from FIG. 6, the conversion gain of the power amplification circuit 12(1) has actually been worsened when the phase modulator 42 is deactivated and only the ripple correction circuit 44 is activated. Instead of reducing the low side band 56 and the high side band 58, the ripple correction circuit 44 has increased the peak L of the low side band 56 and the peak H of the high side band 58 by approximately 9 dB.

Figure 7:
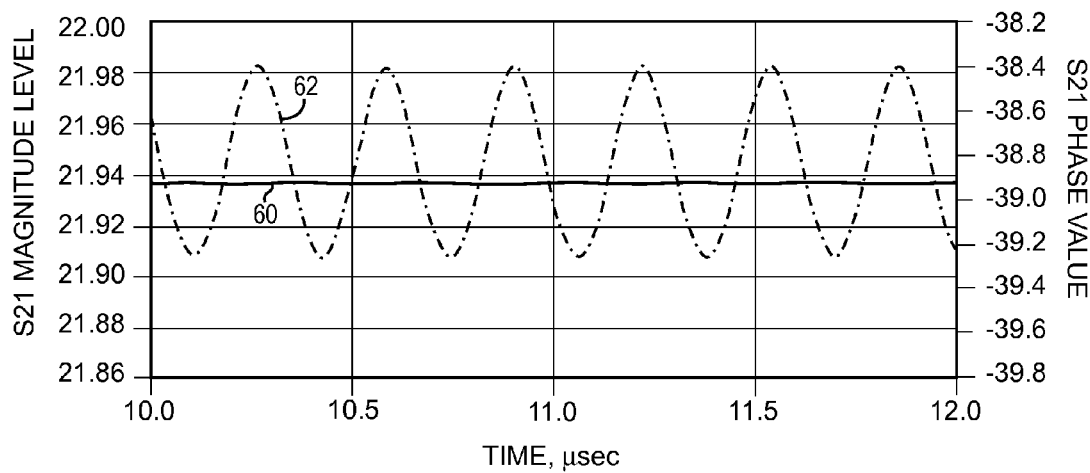
FIG. 7 is another graph of the transfer response of the power amplification device shown in FIG. 2 from the RF input terminus to the RF output terminus when the phase modulator is deactivated and the ripple correction circuit is activated.

Referring now to FIGS. 2 and 7, FIG. 7 is another graph of the transfer response of the power amplification device 10(1) from the RF input terminus 22 to the RF output terminus 24 when the phase modulator 42 is deactivated and the ripple correction circuit 44 is activated. The reason for the worsening in the conversion gain is easy to see from the S21 parameter described in FIG. 7 as a function of time. As shown in FIG. 7, the phase response 62 provided as a result of applying the ripple correction signal 50 to the bias voltage 46 has essentially eliminated the variation of the amplitude response 60 (compare FIG. 7 to FIG. 3). However, applying the ripple correction signal 50 also produces the phase shift PS2 having the phase shift value PSVS. As a result, when the phase modulator 42 is deactivated, the phase response 62 is shifted by the phase shift value PSVS of the phase shift PS2, which is produced by the ripple correction signal 50. As shown in FIG. 7, in this case, the phase response 62 has a phase value that varies peak to peak by about 0.84 degrees. As a result, the conversion gain of the power amplification circuit 12(1) actually increases, rather than decreasing, as demonstrated by the output spectrum 54 shown in FIG. 6.

Figure 8:
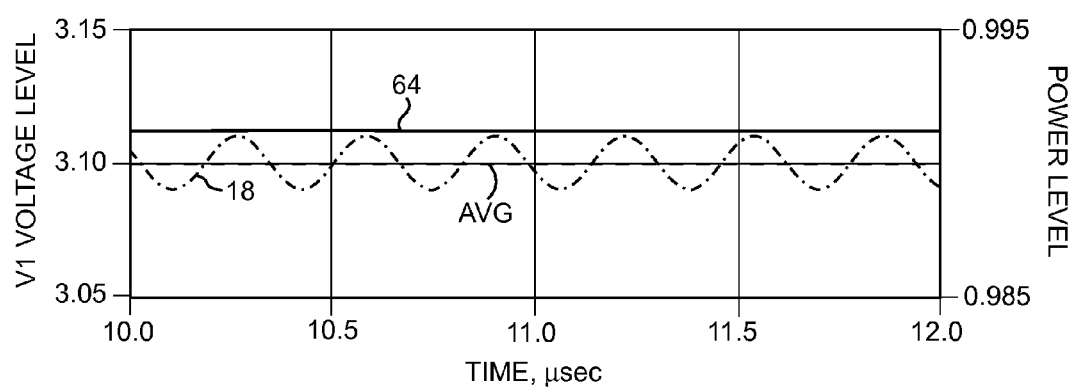
FIG. 8 illustrates one embodiment of the supply voltage level and the output power of the RF signal as a function of time.

Referring now to FIGS. 2 and 8, FIG. 8 illustrates one embodiment of the supply voltage level V1 and the output power 64 of the RF signal 16 as a function of time. The average supply voltage level AVG of the supply voltage level V1 of the supply voltage 18 is also shown. FIG. 8 illustrates that when the ripple correction circuit 44 is on and the phase modulator 42 is deactivated, the ripple correction circuit 44 substantially cancels the ripple variation in the amplitude of the RF signal 16 (as shown by the output power 64). However, instead of reducing the conversion gain, the phase shift PS2 resulting from the ripple correction signal 50 results in the phase shift PS2 being applied to the RF signal 16, and thus the phase of the RF signal 16 varies in accordance with the ripple variation in the supply voltage level V1 of the supply voltage 18.

Figure 9:
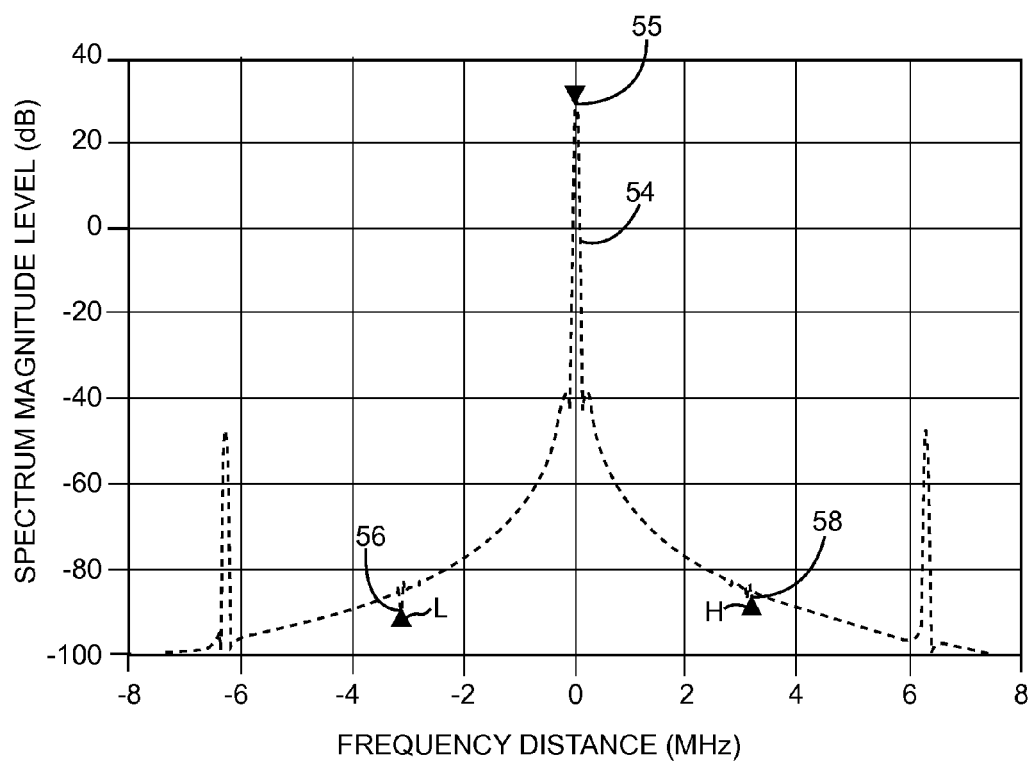
FIG. 9 is a graph illustrating the output spectrum of the power amplification device shown in FIG. 2 when the ripple correction circuit and the phase modulator are activated.

Referring now to FIGS. 2 and 9, FIG. 9 is a graph of the output spectrum 54 of the power amplification device 10(1) when the ripple correction circuit 44 and the phase modulator 42 are activated. As shown in FIG. 9, the peak L of the low side band 56 and the peak H of the high side band 58 are now more than 110 dB below the maximum spectrum magnitude 59 at the carrier frequency. As such, when both the phase modulator 42 and the ripple correction circuit 44 are activated, the phase shift PS1 produced by the phase modulator 42 and the amplitude shift AS with the phase shift PS2 produced by applying the ripple correction signal 50 to the bias voltage 46 substantially cancel the conversion gain of the power amplification circuit 12(1).

Figure 10:
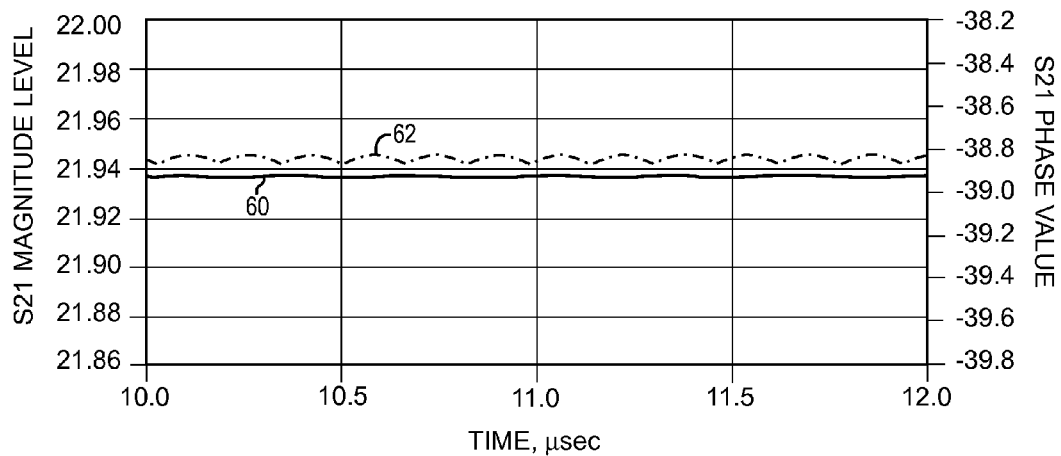
FIG. 10 illustrates one embodiment of the transfer response of the power amplification device shown in FIG. 2 when both the phase modulator and the ripple correction circuit are activated.

Referring now to FIGS. 2 and 10, FIG. 10 illustrates one embodiment of the transfer response of the power amplification device 10(1) when both the phase modulator 42 and the ripple correction circuit 44 are activated. In particular, the graph in FIG. 10 is of the S21 response and illustrates the amplitude response 60 and the phase response 62 when both the phase modulator 42 and the ripple correction circuit 44 are activated. As shown in FIG. 10, by applying the ripple correction signal 50 to the bias voltage 46, the ripple correction circuit 44 produces the phase shift PS1, which results in the cancellation of the ripple variation in the magnitude of the amplitude response 60 (shown in FIG. 10). The scaled parameter $K_2$ is thus selected so that a magnitude of the amplitude response 60 is substantially eliminated by the amplitude shift AS generated by the ripple correction signal 50 of the ripple correction circuit 44. However, as described above, the application of the ripple correction signal 50 results in the phase shift PS2 having the phase shift value PSVS that results in the phase value of the phase response 62 varying in accordance with the ripple variation of the supply voltage level V1. As shown in FIG. 10, when the phase modulator 42 is activated, the phase shift PS1 produced by the phase modulator 42 substantially cancels the ripple variation in the phase value of the phase response 62. In other words, in this example, the scaling parameter $K_1$ for the phase shift value PSA1 is set so that the phase shift PS1 cancels, or is substantially opposite to, the phase shift PS2 resulting from the application of the ripple correction signal 50.

Figure 11:
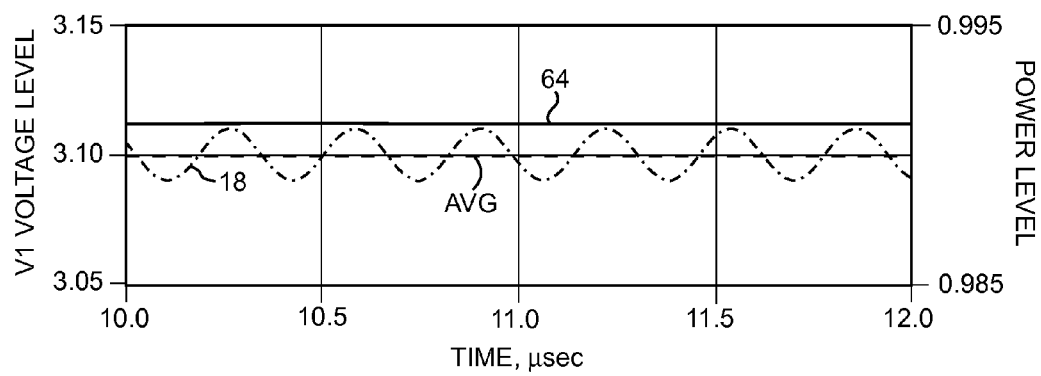
FIG. 11 illustrates one embodiment of the supply voltage and the output power of the RF signal as a function of time when both the phase modulator and the ripple correction circuit are activated simultaneously.

Referring now to FIGS. 2 and 11, FIG. 11 illustrates one embodiment of the supply voltage 18 and the output power of the RF signal 16 as a function of time when both the phase modulator 42 and the ripple correction circuit 44 are activated simultaneously. The output power 64 of the RF signal 16 is shown to be exactly the same as the output power 64 of the RF signal 16 in FIG. 8, thereby reflecting that the ripple correction circuit 44 produces the amplitude shift AS such that the ripple variation of the supply voltage level V1 is substantially eliminated from the amplitude response 60 (shown in FIG. 10). However, as shown in FIG. 9, the modulation of the ripple variation in the phase response 62 (shown in FIG. 10) as a result of the phase shift PS2 (which was produced as a result of the ripple correction signal 50) is substantially eliminated by the phase shift PS1 provided by the phase modulator 42, and thus the conversion gain of the power amplification circuit 12(1) is substantially eliminated. In other words, the ripple variation in the supply voltage level V1 of the supply voltage 18 is substantially rejected.

Figure 12:
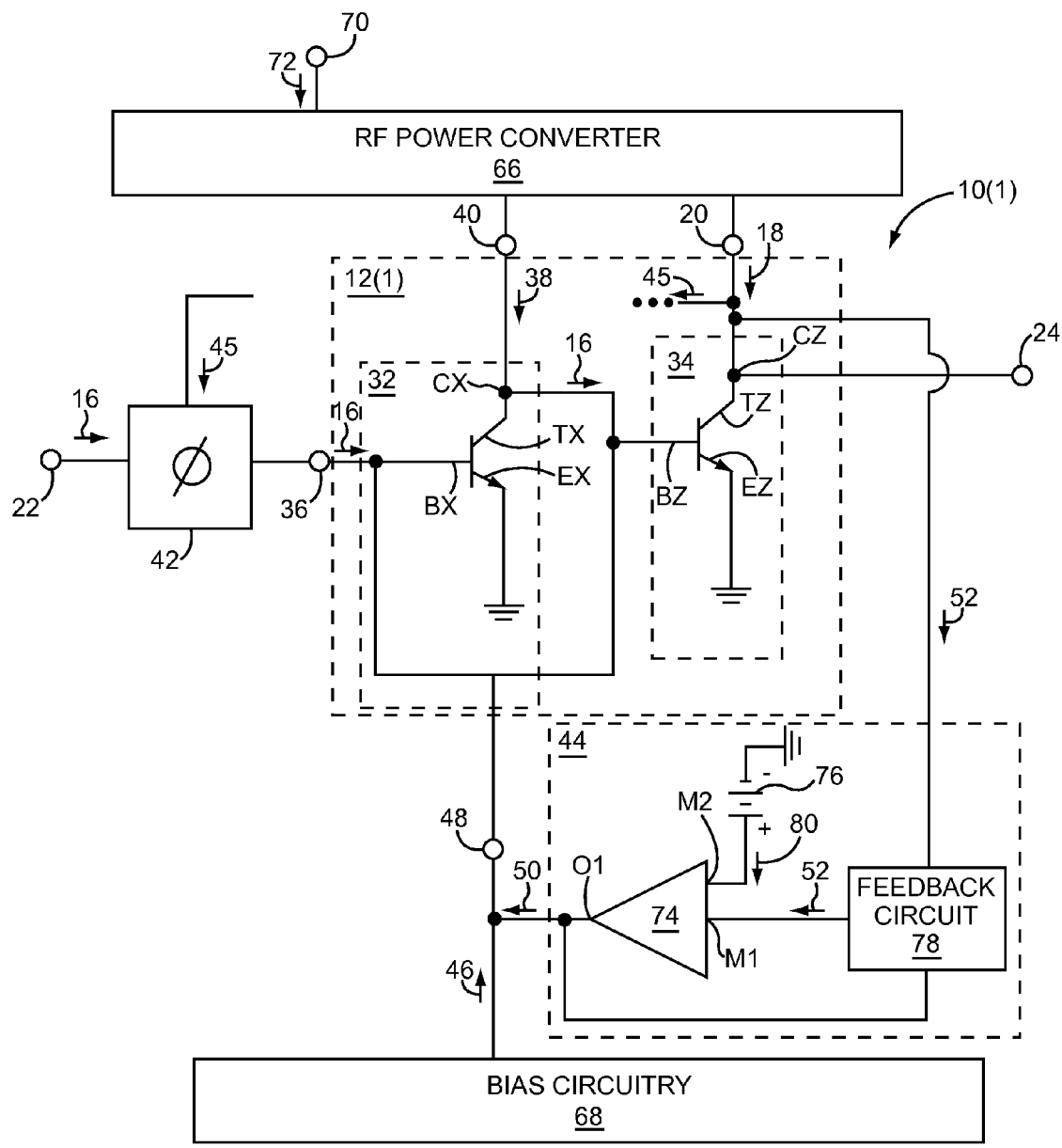
FIG. 12 is a circuit diagram of an exemplary embodiment of the power amplification circuit shown in FIG. 2.

Referring now to FIG. 12, FIG. 12 is a circuit diagram of an exemplary embodiment of the power amplification device 10(1). Thus, the power amplification device 10(1) shown in FIG. 12 operates in the same manner as described above in FIGS. 2-11. However, the exemplary embodiment of the power amplification device 10(1) shown in FIG. 12 further includes an RF power converter 66 and bias circuitry 68. The RF power converter 66 has a power source terminus 70. In this manner, the RF power converter 66 is operable to receive a power source voltage 72. For example, the power source voltage 72 may be received at the RF power converter 66 from a battery, an AC-to-DC converter, and/or the like. The RF power converter 66 is configured to generate the supply voltage 18 from the power source voltage 72, and is also configured to generate the supply voltage 38 from the power source voltage 72. As such, the RF power converter 66 may include one or more switching converters, voltage regulation circuits, and/or the like that are configured to generate the supply voltages 18, 38 from the power source voltage 72. The RF power converter 66 is coupled to the supply voltage input terminus 40 and the supply voltage input terminus 20 in order to provide the supply voltage 38 and the supply voltage 18, respectively, to the power amplification circuit 12(1).

As shown in FIG. 12, the initial amplifier stage 32 includes a transistor TX, which in this example is a bipolar junction transistor (BJT). The transistor TX includes a base BX, a collector CX, and an emitter EX. The collector CX is coupled to the supply voltage input terminus 40 in order to receive the supply voltage 38. The transistor TX has the initial amplification gain Ginitial, which is set in accordance with a supply voltage level of the supply voltage 38. In this embodiment, the collector CX is coupled to the supply voltage input terminus 40 so that the supply voltage 38 powers amplification by the initial amplifier stage 32. The base BX of the transistor TX is coupled to the amplifier input terminus 36 so that the transistor TX receives the RF signal 16. The emitter EX of the transistor TX is coupled to ground in this example. The transistor TX is configured to amplify the RF signal 16 with the supply voltage 38, which is then transmitted to the final amplifier stage 34 from the collector CX.

The final amplifier stage 34 also includes a transistor TZ, which is also a BJT. The transistor TZ includes a collector CZ, an emitter EZ, and a base BZ. The transistor TZ has the final amplification gain Gfinal, which is set in accordance with the supply voltage level V1 of the supply voltage 18. More specifically, the collector CZ of the transistor TZ is coupled to the supply voltage input terminus 20 in order to receive the supply voltage 18 from the RF power converter 66. The emitter EZ of the transistor TZ is coupled to ground in this example. The base BZ of the transistor TZ is coupled to the collector CX of the transistor TX in order to receive the RF signal 16 after amplification by the transistor TX. The transistor TZ then amplifies the RF signal 16 with the supply voltage 18. The collector CZ of the transistor TZ is coupled to the RF output terminus 24. The transistor TZ transmits the RF signal 16 from the collector CZ to the RF output terminus 24 after the RF signal 16 has been amplified by the transistor TZ.

As shown in FIG. 12, the bias circuitry 68 is configured to generate the bias voltage 46. The ripple correction circuit 44 is coupled between the bias input terminus 48 and the bias circuitry 68 so that the ripple correction signal 50 is applied to the bias voltage 46 before the bias voltage 46 is received at the bias input terminus 48. Note that both the base BX of the transistor TX and the base BZ of the transistor TZ are coupled to the bias input terminus 48. In this manner, the bias voltage 46 is applied at both the base BX and the base BZ to the RF signal 16. Thus, the bias voltage 46 sets the quiescent operating voltage level for amplification of the RF signal 16 by both the transistor TX and the transistor TZ.

One embodiment of the phase modulator 42 is shown in FIG. 12. The phase modulator 42 is coupled between the RF input terminus 22 and the amplifier input terminus 36 to apply the phase shift PS1 to the RF signal 16 as described above. The phase modulator 42 is also coupled to the RF output terminus 24 in order to receive the feedback signal 52 in order to generate the phase shift PS1 based on the supply voltage level V1. The phase modulator 42 is configured to have the scaling parameter $K_1$, as described above.

One embodiment of the ripple correction circuit 44 is also shown in FIG. 12. The ripple correction circuit 44 includes an operational amplifier 74, a DC voltage source 76, and a feedback circuit 78. The feedback circuit 78 is coupled to the RF output terminus 24 in order to receive the feedback signal 52. The feedback circuit 78 is configured to attenuate the feedback signal level of the feedback signal 52 and then transmit the feedback signal 52 to an operational amplifier input terminal M1 of the operational amplifier 74. The DC voltage source 76 is configured to generate a DC voltage 80 having a DC voltage level DCL. The DC voltage 80 is received at an operational amplifier input terminal M2 of the operational amplifier 74. Note that the feedback signal level of the feedback signal 52 will vary in accordance with the supply voltage level V1 of the supply voltage 18. The DC voltage level DCL generated by the DC voltage 80 is indicative of the average supply voltage level AVG (see FIGS. 5, 8, and 11) which the supply voltage 18 would have if there were no ripple variation in the supply voltage 18. The operational amplifier 74 then generates the ripple correction signal 50 from an operational amplifier output terminal O1 based on a voltage difference between the feedback voltage level at the operational amplifier input terminal M1 and the DC voltage level DCL at the operational amplifier input terminal M2. More specifically, the ripple correction voltage level RC (see equation above) of the ripple correction signal 50 is generated by the operational amplifier 74 to produce the amplitude shift AS and the phase shift PS1 as described above with regard to FIGS. 2-11.

The ripple correction circuit 44 shown in FIG. 12 is configured such that a feedback resistance of the feedback circuit 78 sets a gain of the operational amplifier 74. Given this feedback resistance, the expected feedback signal range of the feedback voltage level of the feedback signal 52 at the operational amplifier input terminal M1, the operational characteristics of the operational amplifier 74, and other factors important to calibration, the feedback resistance of the feedback circuit 78 is set so that the scaling constant $K_2$ is provided at the appropriate value. Given the characteristics described above with regard to FIGS. 2-11, the optimum value of the scaling constant $K_1$ was found to be approximately equal to 42.62 and the optimum value of the scaling constant $K_2$ was found to be approximately −21.29. With the bias voltage level of the bias voltage being represented by VBS, the scaling parameters $K_1$ and $K_2$ have been provided to satisfy the following differential equations:

$$K_2 \frac{\partial AO}{\partial VBS} + \frac{\partial AO}{\partial V1} \cong 0; \text{ and}$$

$$K_2 \frac{\partial PO}{\partial VBS} + K_1 \frac{\partial PO}{\partial PSA1} + \frac{\partial PO}{\partial V1} \cong 0.$$

The value of the partial derivative of the phase of the RF signal 16 with respect to the supply voltage level V1 is zero (0), as demonstrated by the discussion with respect to FIG. 4. The other partial derivatives in the equations above have been determined through circuit simulations assuming that the average supply voltage level AVG (see FIGS. 5, 8, and 11) was approximately equal to 3.10 volts (V). To determine the values of the scaling constants $K_1$ and $K_2$ once the partial derivatives have been determined is simply a matter of solving the two simultaneous equations. Note that to determine the partial derivatives rather than circuit simulations, empirical observations may also be utilized. While the values of the scaling constants $K_1$ and $K_2$ were determined assuming that the average supply voltage level AVG was 3.10 V and was maintained substantially constant, in other embodiments, such as for envelope tracking, the average supply voltage level AVG may be changing over time. As such, the values of the scaling constants $K_1$ and $K_2$ would also have to change in order to meet the differential equations at the particular average supply voltage level AVG of the supply voltage 18. In this case, the partial derivatives from the equations above may be determined at various values of the supply voltage level V1 depending on the expected range of the supply voltage level V1. The corresponding values for the scaling constants $K_1$ and $K_2$ that would satisfy the equations above throughout the range of the supply voltage level V1 would also be determined. In this case, a control circuit (not shown) may be provided to adjust the scaling constant $K_1$ of the phase modulator 42 accordingly, and the scaling constant $K_2$ of the ripple correction circuit 44 accordingly. With regard to the ripple correction circuit 44 shown in FIG. 2, the feedback resistance of the feedback circuit 78 may be variable, thus allowing the scaling constant $K_2$ to be adjusted when the average supply voltage level AVG is changed. Similarly, the DC supply voltage level DCL of the DC voltage 80 may likewise be adjustable by the control circuit so that it corresponds with the appropriate supply voltage level V1

Figure 13:
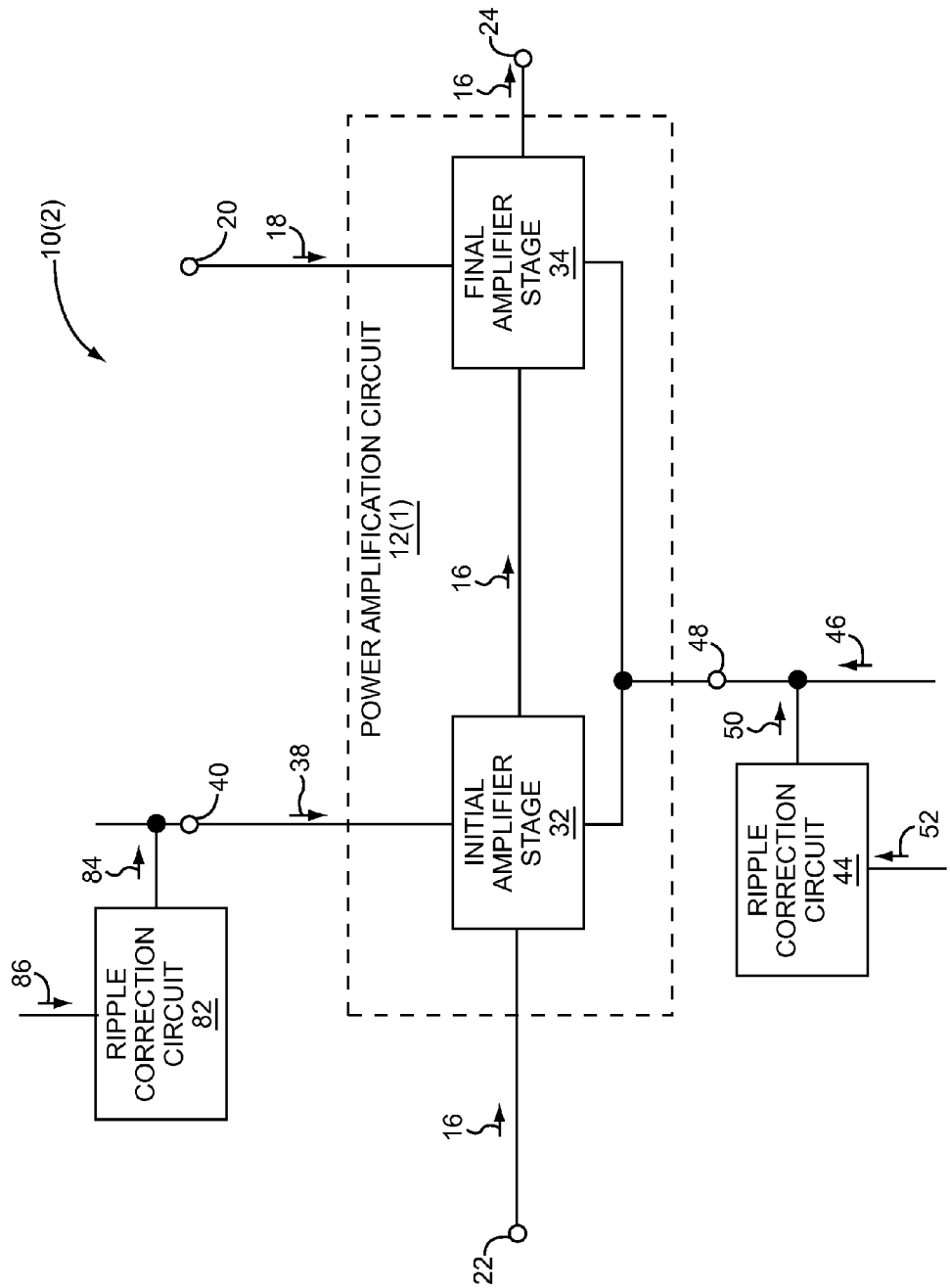
FIG. 13 illustrates another embodiment of a power amplification device.

FIG. 13 illustrates another embodiment of a power amplification device 10(2). The power amplification device 10(2)

is another embodiment of the power amplification device 10 shown in FIG. 1. The power amplification device 10(2) includes the power amplification circuit 12(1) described above with respect to FIG. 2 and the ripple correction circuit 44 also described above with respect to FIG. 2. The ripple correction circuit 44 operates in the same manner as described above, except that the scaling parameter $K_2$ has been set to a different value for reasons described below. In this embodiment, the initial amplifier stage 32 is coupled to the RF input terminus 22, and the RF input terminus 22 thus also serves as an amplifier input terminus. Thus, a separate amplifier input terminus 36 like the one shown in FIG. 2 does not have to be provided. This embodiment of the power amplification device 10(2) does not include the phase modulator 42 shown in FIG. 2. Rather, the power amplification device 10(2) includes a ripple correction circuit 82. As mentioned above, the ripple correction circuit 44 produces the phase shift PS2 and the amplitude shift AS by applying the ripple correction signal 50 to the bias voltage 46. In this embodiment, the ripple correction circuit 82 is configured to produce a phase shift PS3 and an amplitude shift AS3 on the RF signal 16. The ripple correction circuit 82 is coupled to the supply voltage input terminus 40 and is thus one embodiment of the ripple rejection circuit 14A illustrated in FIG. 1. The phase shift PS3 and the amplitude AS3 are produced by the ripple correction circuit 82 in combination with the amplitude shift AS and the phase shift PS2 produced by the ripple correction circuit 44 to reduce, and in this case substantially eliminate, the conversion gain of the power amplification circuit 12(1). To produce the phase shift PS3 and the amplitude shift AS3, the ripple correction circuit 82 is configured to generate a ripple correction signal 84 based on the supply voltage level V1 of the supply voltage 18. The ripple correction circuit 82 is coupled to the supply voltage input terminus 40 such that the ripple correction signal 84 is applied to the supply voltage 38 before the supply voltage 38 is received by the supply voltage input terminus 40 and the initial amplifier stage 32. The ripple correction signal 84 is thus an embodiment of the ripple correction signal 30A and the supply voltage 38 is an embodiment of the input signal 28A shown in FIG. 1.

Referring again to FIG. 13, the ripple correction circuit 82 produces the amplitude shift AS3 and the phase shift PS3 by applying the ripple correction signal 84 to the supply voltage 38. The ripple correction circuit 82 is configured to generate the ripple correction signal 84 having a ripple correction voltage level RC3 set such that:

$$RC3 \cong K_3 \times V1, \text{ where } K_3 \text{ is a scaling constant } K_3.$$

As shown by the equation above, the ripple correction voltage level RC3 of the ripple correction signal 84 is based on the supply voltage level V1. To do this, the ripple correction circuit 82 may receive a feedback signal 86 having a feedback voltage level that is indicative of the supply voltage level V1 of the supply voltage 18. When the ripple correction circuit 44 generates the ripple correction signal 50 and the ripple correction circuit 82 generates the ripple correction signal 84 simultaneously, the modulation of the ripple variation in the supply voltage level V1 of the supply voltage 18 onto the RF signal 16 is substantially rejected as a result of the conversion gain of the power amplification circuit 12(1) being substantially eliminated. The particular values of the scaling parameters $K_2$ and $K_3$ are set to provide the phase shifts PS2, PS3 and the amplitude shifts AS, AS3 to substantially eliminate the conversion gain of the power amplification circuit 12(1).

Figure 14:
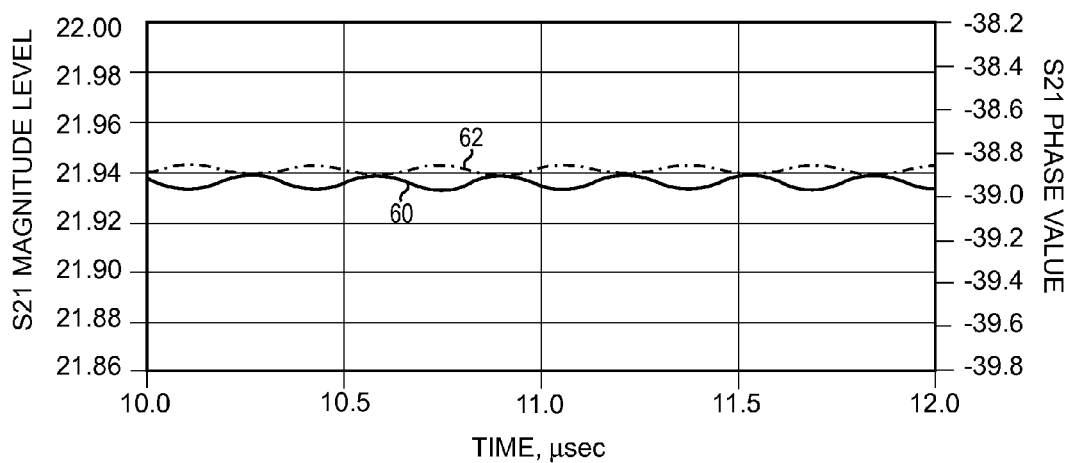
FIG. 14 illustrates one embodiment of transfer response of the power amplification device shown in FIG. 13 when the bias correction circuit is activated and the ripple correction circuit is deactivated.

Referring now to FIGS. 13 and 14, FIG. 14 illustrates one embodiment of transfer response of the power amplification device 10(2) when the ripple correction circuit 44 is activated and the ripple correction circuit 82 is deactivated. In particular, the transfer response shown in FIG. 14 is illustrated as an S21 parameter of the power amplification device 10(2) from the RF input terminus 22 to the RF output terminus 24, and thus the transfer response has the amplitude response 60 and the phase response 62. Note that when both the ripple correction circuit 44 and the ripple correction circuit 82 are deactivated, the transfer response is the same as the transfer response shown in FIG. 4 when the phase modulator 42 and the ripple correction circuit 44 were deactivated. Thus, when both the ripple correction circuit 44 and the ripple correction circuit 82 shown in FIG. 13 are deactivated, the output spectrum 54 is provided as shown in FIG. 3.

Also, note that the amplitude response 60 and the phase response 62 are different than the amplitude response 60 and the phase response 62 shown in FIG. 7. This is because the scaling parameter $K_2$ for the ripple correction circuit 44 is different in FIG. 14 than in FIG. 7. In particular, the scaling parameter $K_2$ has been set to equal −13.372. The amplitude shift AS and the phase shift PS1 are thus applied to the amplitude response 60 and the phase response 62, respectively, such that the amplitude response 60 and the phase response 62 are provided as shown in FIG. 14.

Figure 15:
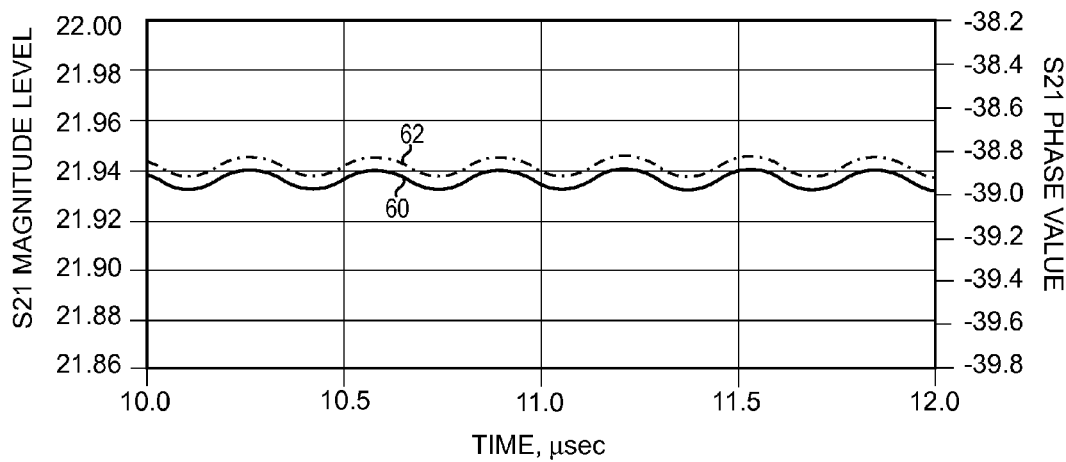
FIG. 15 illustrates a graph of the transfer response (and in particular the S21 response) of the power amplification device shown in FIG. 13 when the ripple correction circuit is activated and the ripple correction circuit is deactivated.

Referring now to FIG. 13 and FIG. 15, FIG. 15 illustrates a graph of the transfer response (and in particular the S21 response) of the power amplification device 10(2) when the ripple correction circuit 82 is activated and the ripple correction circuit 44 is deactivated. Comparing the transfer response shown in FIG. 4 for the power amplification device 10(1) shown in FIG. 2 with the transfer response shown in FIG. 15 for the power amplification device 10(2) shown in FIG. 13, the transfer response of the power amplification device 10(1) and the power amplification device 10(2) are the same if the ripple correction circuit 44 and the phase modulator 42 of the power amplification device 10(1) shown in FIG. 2 are deactivated and the ripple correction circuit 44 and the ripple correction circuit 82 of the power amplification device 10(2) shown in FIG. 13 are deactivated. In this embodiment, FIG. 15 demonstrates that the amplitude shift AS3 and the phase shift PS3 adjust the amplitude response 60 and the phase response 62 such that the amplitude response 60 and the phase response 62 are provided as shown in FIG. 15. Again, the amplitude shift AS3 and the phase shift PS3 are produced by the ripple correction circuit 82 by applying the ripple correction signal 84 to the supply voltage 38 before the supply voltage 38 is received by the initial amplifier stage 32. In this example, the scaling parameter $K_3$ is −5.35.

Figure 16:
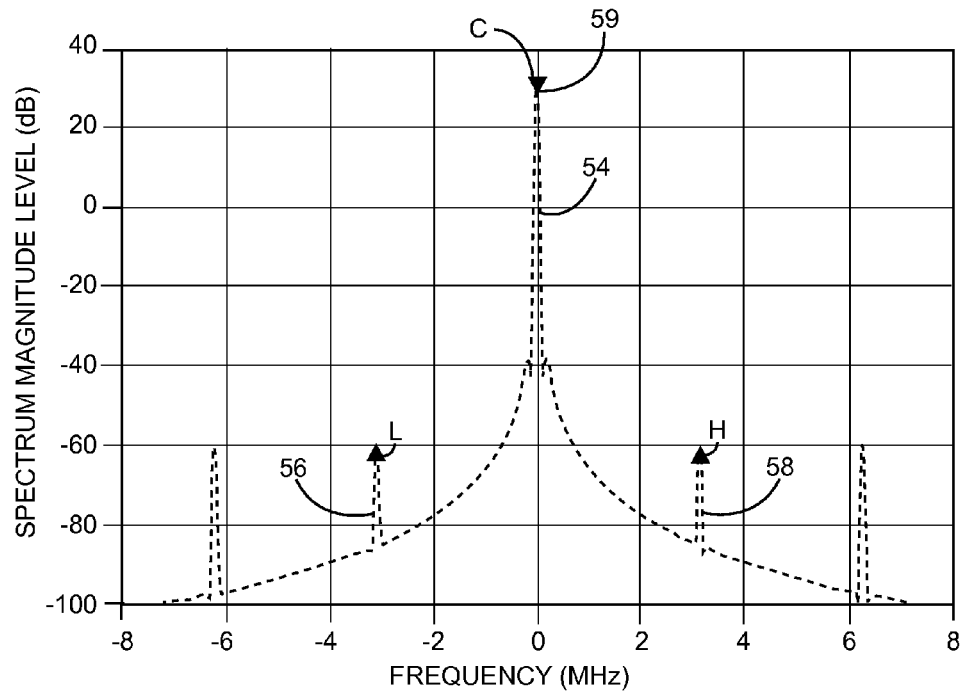
FIG. 16 illustrates one embodiment of the output spectrum of the power amplification device shown in FIG. 13 when the ripple correction circuit and the ripple correction circuit are both activated.

Referring now to FIGS. 13 and 16, FIG. 16 illustrates one embodiment of the output spectrum 54 of the power amplification device 10(2) when the ripple correction circuit 44 and the ripple correction circuit 82 are both activated. In comparison to the output spectrum 54 shown in FIG. 3, it can be seen that the ripple correction circuits 44 and 82 have substantially eliminated the conversion gain of the power amplification circuit 12(1) shown in FIG. 14. In particular, the peak L of the low side band 56 and the peak H of the high side band 58 have been reduced so as to be almost 90 dB lower than the maximum spectrum magnitude 59 at the carrier frequency C.

Figure 17:
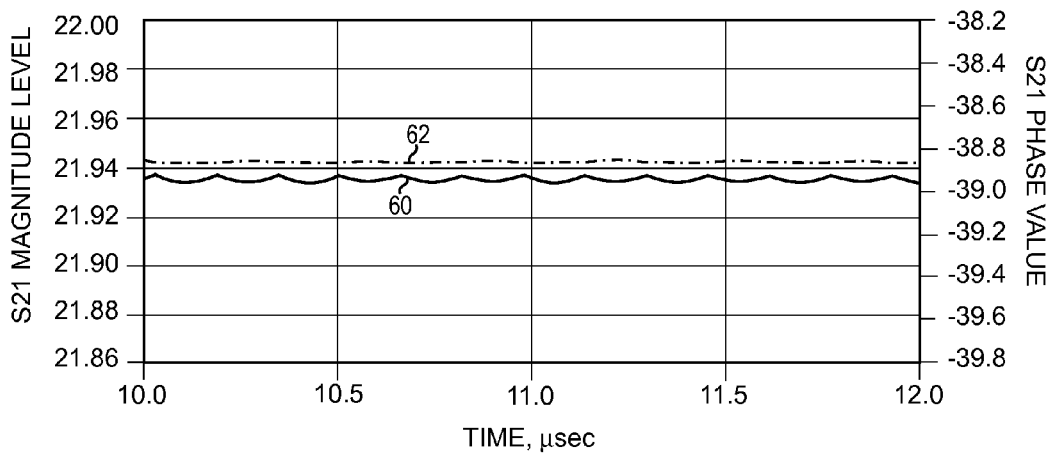
FIG. 17 illustrates the transfer response of the power amplification device shown in FIG. 13 when both the ripple correction circuit and the ripple correction are activated.

Referring now to FIGS. 13 and 17, FIG. 17 illustrates the transfer response of the power amplification device 10(2) when both the ripple correction circuit 44 and the ripple correction circuit 82 are activated. As mentioned above, the ripple correction circuit 44 generates the phase shift PS2 and the amplitude shift AS by applying the ripple correction signal 50 to the bias voltage 46. In addition, the ripple correction circuit 82 produces the phase shift PS3 and the amplitude shift AS3 by applying the ripple correction signal 84 to the supply voltage 38.

As can be seen from FIG. 17, the amplitude shift AS resulting from the ripple correction signal 50 and the amplitude shift AS3 resulting from the ripple correction signal 84 adjust the amplitude response 60 of the power amplification device 10(2) so as to substantially eliminate the modulation of the ripple variation in the supply voltage level V1 of the supply voltage 18 in the amplitude response 60. In addition, the phase shift PS2 produced by the ripple correction circuit 44 by applying the ripple correction signal 50 and the phase shift PS3 produced by the ripple correction circuit 82 by applying the ripple correction signal 84 substantially eliminate the modulation of the ripple variation in the supply voltage level V1 of the supply voltage 18 on the phase response 62 of the power amplification device 10(2). Accordingly, the ripple correction circuit 44 and the ripple correction circuit 82 are configured to produce the phase shifts PS2, PS3 and the amplitude shifts AS, AS3 such that the conversion gain of the power amplification circuit 12(1) is substantially eliminated and the modulation of the ripple variation in the supply voltage level V1 of the supply voltage 18 onto the RF signal 16 is substantially rejected.

Figure 18:
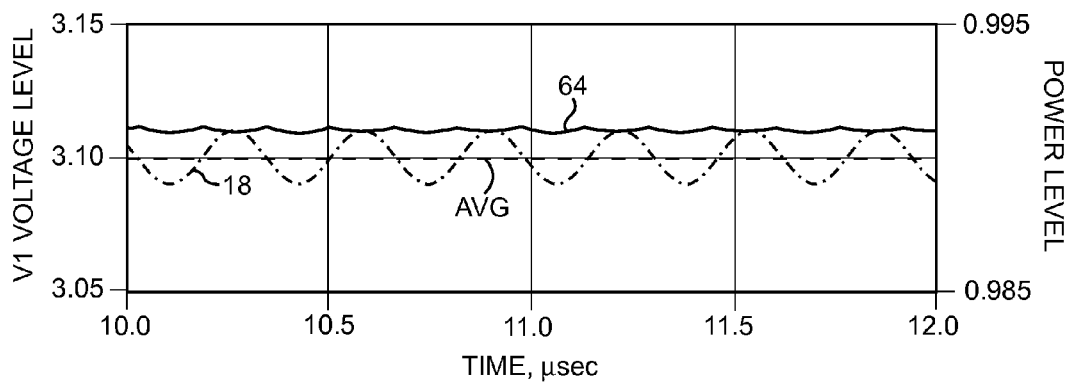
FIG. 18 illustrates one embodiment of the supply voltage and the output power of the RF signal as functions of time when both the ripple correction circuit and the ripple correction circuit are activated.

Referring now to FIGS. 13 and 18, FIG. 18 illustrates one embodiment of the supply voltage 18 and the output power 64 of the RF signal 16 as functions of time when both the ripple correction circuit 44 and the ripple correction circuit 82 are activated. As shown in FIG. 18, the supply voltage level V1 of the supply voltage 18 has a ripple variation of approximately 20 mV peak to peak, where the supply voltage level V1 of the supply voltage 18 varies about the average supply voltage level AVG of approximately 3.10 V. As shown by FIG. 18, the amplitude shift AS and the amplitude shift AS3 produced by the ripple correction circuits 44, 82 have substantially eliminated the ripple variation in the magnitude (i.e., the signal level) of the RF signal 16. This is demonstrated by the output power 64 of the RF signal 16 as shown in FIG. 18.

Figure 19:
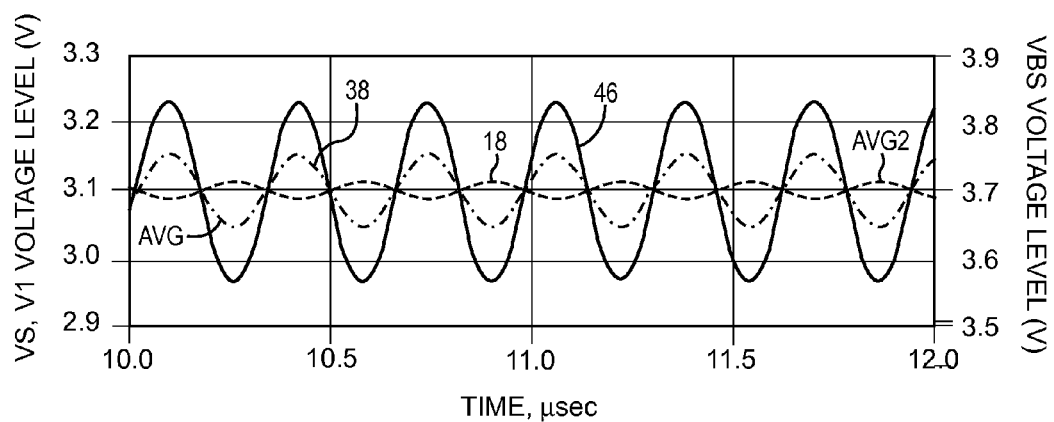
FIG. 19 illustrates one embodiment of the supply voltage to a final amplifier stage, a supply voltage to a driver (initial) amplifier stage (once a ripple correction signal has been applied), and the bias voltage to both the final amplifier stage and the driver amplifier stage once a ripple correction signal has been applied.

Referring now to FIGS. 13 and 19, FIG. 19 illustrates one embodiment of the supply voltage 18; the supply voltage 38 once the ripple correction signal 84 has been applied; and the bias voltage 46 once the ripple correction signal 50 has been applied. The supply voltage level of the supply voltage 38 is represented by VS, and the bias voltage level of the bias voltage 46 is represented by VBS (the supply voltage level of the supply voltage 18 is V1, as described throughout this disclosure). As shown in FIG. 19, the average supply voltage level of the supply voltage level V1 and an average supply voltage level of the supply voltage level VS are both at the same average supply voltage level AVG, which in this example is approximately 3.1 V. An average bias voltage level of the bias voltage level VBS is a voltage level AVG2, which in this example is approximately 3.7 V. Since the ripple correction signal 50 has been applied to the bias voltage 46, the bias voltage 46 varies in accordance with the ripple variation of the supply voltage level V1 of the supply voltage 18 because the ripple correction signal 50 is based on the supply voltage 18. Similarly, note that the supply voltage level VS of the supply voltage 38 also varies in accordance with the ripple variation in the supply voltage level V1 of the supply voltage 18 because the ripple correction signal 84 is based on the supply voltage level V1 of the supply voltage 18. In this embodiment, both the supply voltage 38 and the bias voltage 46 are opposite in phase to the supply voltage 18.

Figure 20:
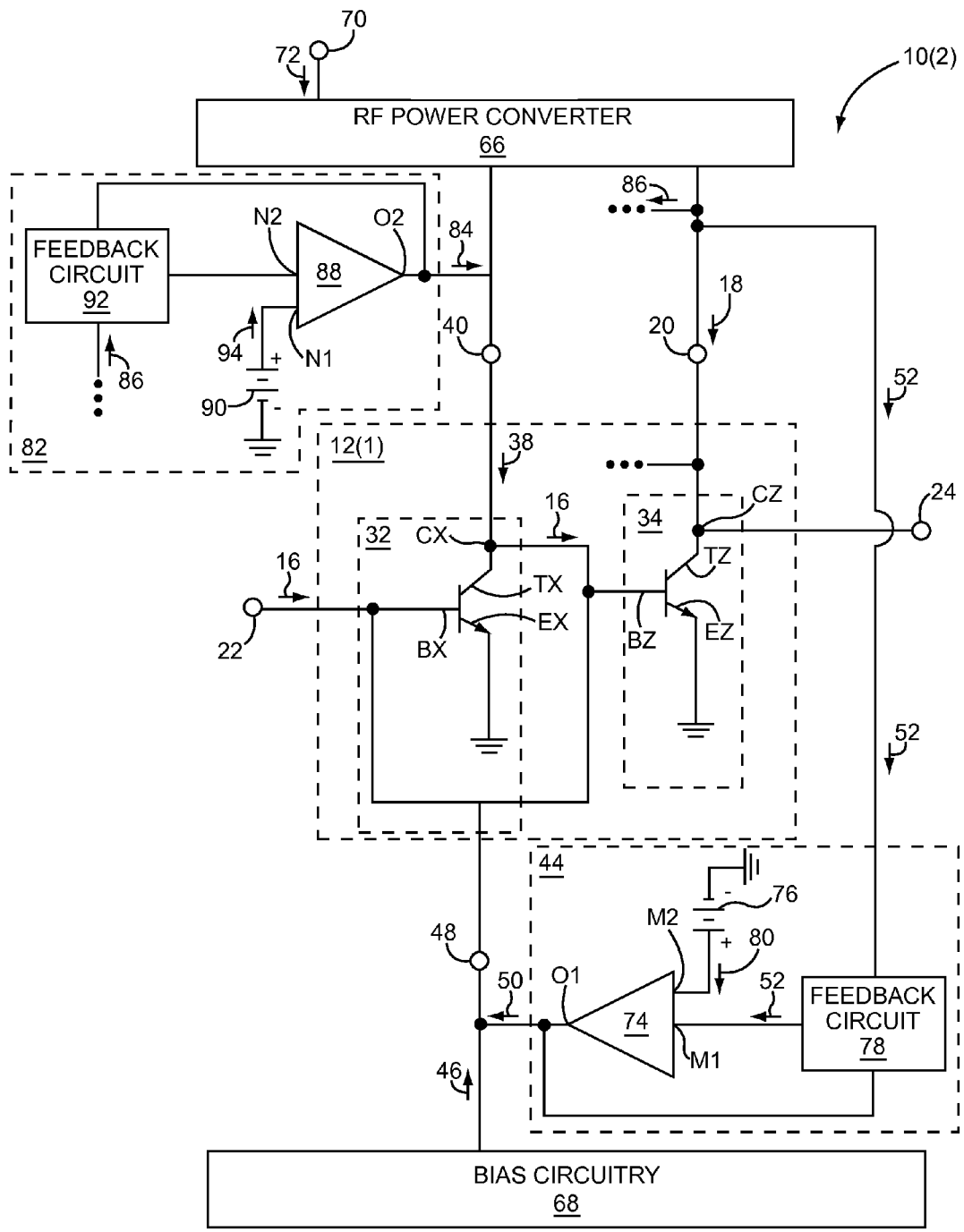
FIG. 20 is a circuit diagram illustrating one exemplary embodiment of the power amplification device shown in FIG. 14.

Referring now to FIG. 20, FIG. 20 is a circuit diagram illustrating one exemplary embodiment of the power amplification device 10(2) shown in FIG. 13. The power amplification device 10(2) includes the power amplification circuit 12(1) shown in FIG. 12. However, in this embodiment, the base BX of the transistor TX in the initial amplifier stage 32 is connected to the RF input terminus 22 of the power amplification device 10(2). The power amplification device 10(2) also includes the RF power converter 66 and the bias circuitry 68 described above with regard to FIG. 12. In addition, the power amplification device 10(2) includes the same embodiment of the ripple correction circuit 44 described above with respect to FIG. 12.

The scaling parameters $K_2$, $K_3$ were determined by solving:

$$K_2 \frac{\partial AO}{\partial VBS} + K_3 \frac{\partial AO}{\partial VS} + \frac{\partial AO}{\partial V1} \cong 0; \text{ and}$$

$$K_2 \frac{\partial PO}{\partial VBS} + K_3 \frac{\partial PO}{\partial VS} + \frac{\partial PO}{\partial V1} \cong 0$$

In this embodiment, the ripple correction circuit 44 has been configured to provide the scaling constant $K_2$ at −13.372. The power amplification device 10(2) further includes an embodiment of the ripple correction circuit 82 described above with respect to FIG. 13. The ripple correction circuit 82 is similar to the ripple correction circuit 44 shown in FIG. 1, except that the scaling constant $K_3$ is around −5.35.

The ripple correction circuit 82 includes an operational amplifier 88, a DC voltage source 90, and a feedback circuit 92. The feedback circuit 92 is coupled to the supply voltage input terminus 40 (coupling is not explicitly shown) in order to receive the feedback signal 86. The operational amplifier 88 has an operational amplifier input terminal N1 coupled to the DC voltage source 90 and an operational amplifier input terminal N2 connected to the feedback circuit 92. The feedback circuit 92 is configured to attenuate the feedback signal level of the feedback signal 86 and then transmit the feedback signal 86 to the operational amplifier input terminal N2 of the operational amplifier 88. The DC voltage source 90 is configured to generate a DC voltage 94 having a DC voltage level DCR. The DC voltage 94 is received at the operational amplifier input terminal N1 of the operational amplifier 88. Note that the feedback signal level of the feedback signal 86 will vary in accordance with the supply voltage level VS of the supply voltage 38. The DC voltage level DCR generated by the DC voltage 94 is indicative of the average supply voltage level which the supply voltage 38 would have if there were no ripple variation in the supply voltage 38. The operational amplifier 88 then generates the ripple correction signal 84 from an operational amplifier output terminal O2 based on a voltage difference between the feedback voltage level at the operational amplifier input terminal N2 and the DC voltage level DCR at the operational amplifier input terminal N1. More specifically, the ripple correction voltage level RC3 (see equation above) of the ripple correction signal 84 is generated by the operational amplifier 88 to produce the amplitude shift AS3 and the phase shift PS3 as described above with regard to FIGS. 17-19.

The ripple correction circuit 82 shown in FIG. 20 is configured such that a feedback resistance of the feedback circuit 92 sets a gain of the operational amplifier 88. Given this feedback resistance, the expected feedback signal range of the feedback voltage level of the feedback signal 86 at the operational amplifier input terminal N2, the operational characteristics of the operational amplifier 88, and other factors important to calibration, the feedback resistance of the feedback circuit 92 is set so that the scaling constant $K_3$ is provided at the appropriate value. Given the characteristics described above with regard to FIGS. 17-19, the optimum value of the scaling constant $K_2$ was found to be approximately equal to −5.35 and the optimum value of the scaling constant $K_3$ was found to be approximately −13.372.

The partial derivatives of the amplitude of the RF signal 16 at the RF output terminus 24 and the partial derivatives of the phase of the RF signal 16 at the RF output terminus 24 are each determined with respect to the supply voltage level V1 of the supply voltage 18, the bias voltage level VBS of the bias voltage 46, and the supply voltage level VS of the supply voltage 38, since each of these is to vary in accordance with the supply voltage level V1 of the supply voltage 18, and thus in accordance with the ripple variation of the supply voltage level V1. Assuming that the average bias voltage level of the bias voltage 46 is set to AVG2, as shown in FIG. 19, and the average supply voltage levels V1, VS are set to AVG as shown in FIG. 19, the partial derivatives were determined to be as follows:

$$\frac{\partial AO}{\partial VBS} \cong .27875$$

$$\frac{\partial AO}{\partial VS} \cong .4123$$

$$\frac{\partial AO}{\partial V1} \cong 5.9375$$

$$\frac{\partial PO}{\partial VBS} \cong -1.98535$$

$$\frac{\partial PO}{\partial VS} \cong 5.0285$$

$$\frac{\partial PO}{\partial V1} \cong .3245.$$

The values of the partial derivatives may be determined using circuit models of the power amplification device 10(2) shown in FIG. 20. Furthermore, if the average supply voltage level V1 of the supply voltage 18, the average supply voltage level VS of the supply voltage 38, and the average bias voltage level VBS of the bias voltage 46 are adjustable (for example, for envelope tracking), a control circuit with a lookup table and digital-to-analog converters (not shown) may be used to adjust a feedback resistance of the feedback circuit 92, the DC supply voltage level DCL, the feedback resistance of the feedback circuit 78, and the DC supply voltage level DCR to set the scaling parameters $K_2$, $K_3$ based on the partial derivatives for those average voltage levels V1, VS, VBS.

Figure 21:
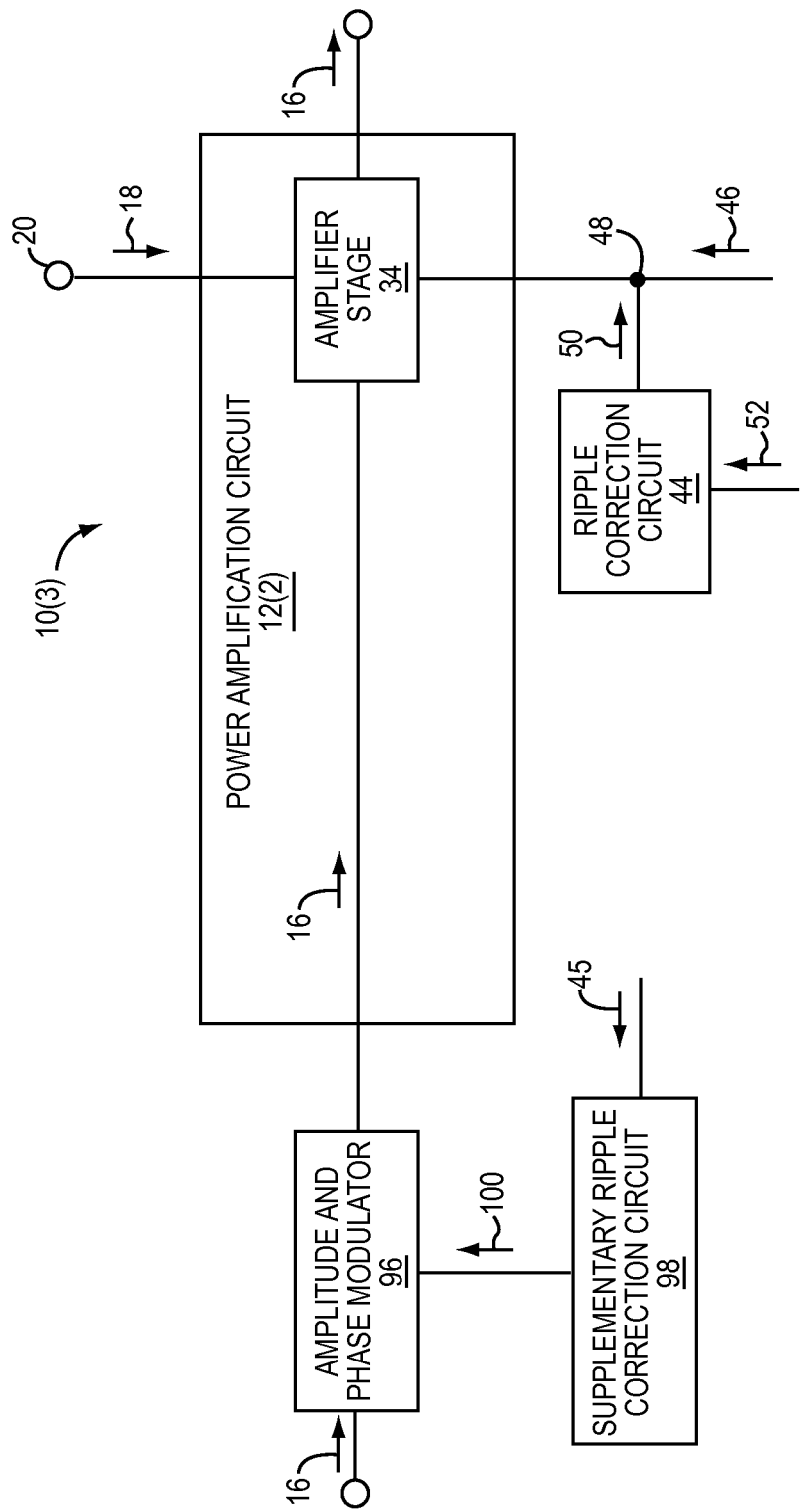
FIG. 21 is a circuit diagram illustrating another exemplary embodiment of a power amplification device.

FIG. 21 is a circuit diagram illustrating another exemplary embodiment of a power amplification device 10(3). The power amplification device 10(3) includes a power amplification circuit 12(2), the ripple correction circuit 44, an amplitude and phase modulator 96, and a supplementary ripple correction circuit 98. In this embodiment, the power amplification circuit 12(2) only includes an amplifier stage 34', which is similar to the final amplifier stage 34 described above with respect to FIG. 2. Thus, the power amplification circuit 12(2) is a single stage amplifier.

The ripple correction circuit 44 operates in the same manner described above with respect to FIG. 2. However, in this embodiment, the amplitude and phase modulator 96 is provided instead of the phase modulator 42 shown in FIG. 2. It is presumed that the scaling parameter of the amplitude and phase modulator 96 is difficult to provide at a desired value. As such, the supplementary ripple correction circuit 98 is operably associated with the amplitude and phase modulator 96. In this embodiment, the supplementary ripple correction circuit 98 has a scaling parameter that is easier to control. As such, the supplementary ripple correction circuit 98 is configured to receive the feedback signal 45 and generate a supplementary feedback signal 100, which is a version of the feedback signal 45 scaled by the scaling parameter of the supplementary ripple correction circuit 98. The amplitude and phase modulator 96 is configured to receive the supplementary feedback signal 100. In this manner, the amplitude and phase modulator 96 provides a phase shift and an amplitude shift in accordance with a supplementary feedback signal level of the supplementary feedback signal 100 and the scaling parameter of the amplitude and phase modulator 96. The combination of the scaling parameter of the amplitude and phase modulator 96 and the scaling parameter of the supplementary ripple correction circuit 98 provides an overall scaling parameter at the desired value. In this manner, the amplitude and phase modulator 96, the supplementary ripple correction circuit 98, and the ripple correction circuit 44 provide phase shifts and amplitude shifts that reduce a conversion gain of the power amplification circuit 12(2).

Those skilled in the art will recognize improvements and modifications to the preferred embodiments of the present disclosure. All such improvements and modifications are considered within the scope of the concepts disclosed herein and the claims that follow.

What is claimed is:

1. A power amplification device comprising:
   a power amplification circuit having a conversion gain and configured to amplify a radio frequency (RF) signal with a supply voltage such that a ripple variation in a supply voltage level of the supply voltage is modulated onto the RF signal in accordance with the conversion gain; and
   a plurality of ripple rejection circuits configured to produce phase shifts and one or more amplitude shifts in the RF signal so as to reduce the conversion gain of the power amplification circuit, wherein the plurality of ripple rejection circuits comprises a phase modulator configured to receive the RF signal and produce a first phase shift of the phase shifts.

2. The power amplification device of claim 1 wherein the plurality of ripple rejection circuits is configured to produce the phase shifts and the one or more amplitude shifts in the RF signal so as to reduce the conversion gain of the power amplification circuit such that the conversion gain of the power amplification circuit is substantially eliminated.

3. The power amplification device of claim 2 wherein modulation of ripple variation in the supply voltage level of the supply voltage onto the RF signal is substantially rejected as a result of the conversion gain of the power amplification circuit being substantially eliminated.

4. The power amplification device of claim 1 wherein the plurality of ripple rejection circuits is further configured to produce each of the phase shifts and the one or more amplitude shifts based on the supply voltage level of the supply voltage and a plurality of scaling parameters.

5. The power amplification device of claim 4 wherein each of the phase shifts and the one or more amplitude shifts are each based on the supply voltage level of the supply voltage and a corresponding one of the plurality of scaling parameters.

6. The power amplification device of claim 1 wherein the power amplification circuit comprises an initial amplifier stage and a final amplifier stage having a supply voltage input terminus operable to receive the supply voltage.

7. The power amplification device of claim 6 comprising a plurality of input termini that includes the supply voltage input terminus, wherein each of the plurality of ripple correction circuits is coupled to a corresponding one of the input termini other than the supply voltage input terminus.

8. The power amplification device of claim 1 wherein the power amplification circuit further comprises an amplifier input terminus, and wherein the phase modulator is coupled to the amplifier input terminus.

9. The power amplification device of claim 8 further comprising an RF input terminus wherein:
the power amplification device is operable to receive the RF signal at the RF input terminus; and
the phase modulator is coupled between the RF input terminus and the amplifier input terminus such that the phase modulator produces the first phase shift in the RF signal at the amplifier input terminus.

10. The power amplification device of claim 8 further comprising a first input terminus for receiving an input signal, and wherein the plurality of ripple rejection circuits further comprises a ripple correction circuit configured to produce a first amplitude shift of the one or more amplitude shifts and a second phase shift of the phase shifts.

11. The power amplification device of claim 10 further comprising the first input terminus for receiving the input signal and the ripple correction circuit further configured to generate a ripple correction signal and produce the first amplitude shift of the one or more amplitude shifts and the second phase shift of the phase shifts by applying the ripple correction signal to the input signal.

12. The power amplification device of claim 11 wherein:
the first input terminus is a bias voltage input terminus; and
the input signal is a bias voltage.

13. The power amplification device of claim 11 wherein the plurality of ripple rejection circuits consists of the phase modulator and the ripple correction circuit.

14. The power amplification device of claim 13 wherein the power amplification circuit comprises an initial amplifier stage and a final amplifier stage having a supply voltage input terminus operable to receive the supply voltage.

15. The power amplification device of claim 1 wherein the plurality of ripple rejection circuits comprises a first ripple correction circuit configured to produce a first amplitude shift of the one or more amplitude shifts and a first phase shift of the phase shifts.

16. A power amplification device comprising:
a power amplification circuit having a conversion gain and configured to amplify a radio frequency (RF) signal with a supply voltage such that a ripple variation in a supply voltage level of the supply voltage is modulated onto the RF signal in accordance with the conversion gain; and a plurality of ripple rejection circuits configured to produce phase shifts and amplitude shifts in the RF signal so as to reduce the conversion gain of the power amplification circuit, wherein the plurality of ripple rejection circuits comprises a first ripple correction circuit configured to produce a first amplitude shift of the amplitude shifts and a first phase shift of the phase shifts, and a second ripple correction circuit configured to produce a second amplitude shift of the amplitude shifts and a second phase shift of the phase shifts.

17. The power amplification device of claim 16 further comprising a first input terminus for receiving a first input signal and a second input terminus for receiving a second input signal wherein:
the first ripple correction circuit is further configured to generate a first ripple correction signal and produce the first amplitude shift of the one or more amplitude shifts and the first phase shift of the phase shifts by applying the first ripple correction signal to the first input signal; and
the second ripple correction circuit is further configured to generate a second ripple correction signal and produce the second amplitude shift of the one or more amplitude shifts and the second phase shift of the phase shifts by applying the second ripple correction signal to the second input signal.

18. The power amplification device of claim 17 wherein the power amplification circuit comprises:
the bias voltage input terminus as the first input terminus and operable to receive a bias voltage as the first input signal;
an initial amplifier stage having a first supply voltage input terminus as the second input terminus and operable to receive the second input signal as a second supply voltage; and
a final amplifier stage having a second supply voltage input terminus operable to receive the second supply voltage.

19. The power amplification device of claim 18 wherein the plurality of ripple rejection circuits consists of the first ripple correction circuit and the second ripple correction circuit.

20. A method of amplifying a radio frequency (RF) signal comprising:
amplifying the RF signal with a supply voltage having a ripple variation in a supply voltage level of the supply voltage that is modulated onto the RF signal in accordance with a conversion gain; and
producing, with a plurality of ripple rejection circuits, phase shifts and one or more amplitude shifts in the RF signal based on the supply voltage level of the supply voltage so as to reduce the conversion gain, wherein the plurality of ripple rejection circuits comprises a phase modulator configured to receive the RF signal and produce a first phase shift of the phase shifts.

21. The method of claim 20 wherein the phase shifts and the one or more amplitude shifts in the RF signal are produced such that the conversion gain is substantially eliminated.

22. The method of claim 21 wherein the modulation of the ripple variation in the supply voltage level of the supply voltage onto the RF signal is substantially rejected as a result of the conversion gain being substantially eliminated.

* * * * *